United States Patent
Mochida

(10) Patent No.: US 6,560,159 B2
(45) Date of Patent: May 6, 2003

(54) BLOCK ARRANGEMENT FOR SEMICONDUCTOR MEMORY APPARATUS

(75) Inventor: Yoshifumi Mochida, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/867,212

(22) Filed: May 29, 2001

(65) Prior Publication Data

US 2001/0048629 A1 Dec. 6, 2001

(30) Foreign Application Priority Data

May 31, 2000 (JP) ........................................ 2000-163819

(51) Int. Cl.[7] ................................................ G11C 8/00
(52) U.S. Cl. ................... 365/230.03; 365/149
(58) Field of Search ....................... 365/230.03, 230.01, 365/149

(56) References Cited

U.S. PATENT DOCUMENTS 5,499,215 A 3/1996 Hatta 6,064,618 A * 5/2000 Kuriyama et al. ...... 365/230.03

OTHER PUBLICATIONS

N. H.E. Weste, and K. Eshraghian, "Principles of CMOS VLSI Design", pp 574–579, 1993[Appendix 1].

* cited by examiner

*Primary Examiner*—Hoai Ho
(74) *Attorney, Agent, or Firm*—Darryl G. Walker; Bradley T. Sako

(57) ABSTRACT

A semiconductor memory apparatus allowing a memory cell array (SARY) to be divided into a number of blocks (BLK0 to BLK11) that is not a factor of two is provided. Blocks (BLK0 to BLK11) may be arranged into a repeated group of blocks (BLK0 to BLK2, BLK3 to BLK5, BLK6 to BLK8, and BLK9 to BLK11). A group of blocks (BLK0 to BLK2) may have a bit map that can be symmetrical around the center of a center block (BLK1). The semiconductor memory apparatus can include a block selector (400) for selecting a block (BLK0 to BLK11) based on row addresses (X6 to X12). Block selector (400) can include block predecoders (410 and 420) and groups of decoders (4341 to 4343). Block predecoder (410) may select a block in a group of blocks. Block predecoder (420) may select a group of blocks. Blocks may be decoded without overly complicating circuitry.

18 Claims, 19 Drawing Sheets

FIG. 18B

BLOCK ARRANGEMENT FOR SEMICONDUCTOR MEMORY APPARATUS

TECHNICAL FIELD

The present invention relates generally to internal wiring of a semiconductor memory apparatus and more particularly to a semiconductor memory apparatus having a memory cell array divided into a plurality of n-blocks where n is not a power of 2.

BACKGROUND OF THE INVENTION

A DRAM (dynamic random access memory) is an example of a conventional semiconductor memory device. A DRAM has an array of memory cells. Each memory cell stores one bit of data. A DRAM cell is made up of a cell transistor and a cell capacitor. The cell capacitor stores data and the cell transistor provides an access path to the data on the cell capacitor. The cell capacitor stores data by either the presence or absence of charge on the capacitor in accordance with the stored data value.

The memory cells are arranged in a matrix of rows and columns. A word line is electrically connected to a plurality of cells in the row direction and bit lines are electrically connected to a plurality of memory cells in the column direction. A memory cell is formed at the intersection of a bit line and a word line. The cell transistor is electrically connected to a word line at a control gate. The cell transistor provides a controllable impedance path between a bit line and the cell capacitor.

When reading data from a memory cell, a word line is selected and the cell transistor provides a low impedance path from the bit line to the cell capacitor. This allows electrical charge to be transferred between the cell capacitor and the bit line. The charge sharing between the cell capacitor an the bit line provides a data signal to be placed on the bit line. The data signal is a change in the bit line potential based on the addition or removal of charge on the bit line. The magnitude of the data signal is determined by the ratio of the capacitance value of the bit line (Cd) and the capacitance value of the cell capacitor (Cs). The smaller the capacitance ratio (Cd/Cs), the larger the magnitude of the data signal placed on the bit line. This can increase the noise margin when reading data. The greater the capacitance ratio (Cd/Cs), the smaller the magnitude of the data signal placed on the bit line. This can decrease the noise margins when reading data. For these reasons, it is desirable to reduce the capacitance of the bit line so that the capacitance ratio (Cd/Cs) does not become too large.

In a conventional semiconductor memory device, the memory cell array is divided into a plurality of blocks. This reduces the number of memory cells connected to one bit line, thus decreasing the bit line capacitance and improving the data signal on a bit line during a read operation. When the number of blocks increases, the chip size typically increases. This can be due to the increased number of sense amplifiers required and circuitry associated with selecting a block. Thus, the number of blocks is typically determined by a maximum allowable capacitance ratio (Cd/Cs). For example, in a 256 Mbit DRAM, the memory cell array may be divided into sixteen blocks and there may be 512 memory cells connected to one bit line. This can give a capacitance ratio of approximately 7 to 8.

The block division of the memory cell array in a conventional semiconductor memory device will now be explained.

Referring now to FIG. 1, a 256 M-bit (megabit) synchronous DRAM (SDRAM) is set forth in a block schematic diagram and given the general reference character 100.

SDRAM 100 includes four banks (100A to 100D). Each bank has a memory density of sixty-four M-bits divided into four sub-arrays SARY. Each bank can provide 16 bits of data onto the external data pins (DQ0 to DQ15). The 16 bits of data are divided into four groups. DQ0 to DQ3 form one group of data. DQ4 to DQ7, DQ8 to DQ11, and DQ12 to DQ15, respectively, form the other groups. Each sub-array SARY can store bits from one group of data.

Referring now to FIG. 19, the bit-map illustrating the address mapping of a conventional sub-array is set forth.

The sub-array is divided into sixteen blocks (XBLK0 to XBLK15) with block XBLK0 illustrated by right cross-hatching. Each block has five-hundred-and-twelve rows of memory cells. Each block (XBLK0 to XBLK15) is further divided into four small equal block sections, which can be addressed by column addresses. A block section from block XBLK15 is illustrated by left cross-hatching. Each sub-array has a total of sixty-four block sections of memory cells. In the example illustrated in FIG. 19, the sixteen blocks (XBLK0 to XBLK15) are selected by row addresses X9 to X12 as illustrated in the bit map. The four block sections in one sub-array are selected by column addresses Y7 and Y8. In this way, one of the sixty-four block sections is selected according to the value of row addresses X9 to X12 and column addresses Y7 and Y8. For example, the left cross-hatched block section is selected when row addresses X12 to X9 have the value (1111) and column addresses Y8, Y7 have the value (11).

Sense amplifiers are provided for each block (XBLK0 to XBLK15). Each bit line (or bit line pair) within a block (XBLK0 to XBLK15) can be electrically connected to a sense amplifier. The bit lines are disposed in the vertical direction in the sub-array illustrated in FIG. 19. Each bit line within a block (XBLK0 to XBLK15) is connected to five-hundred-and-twelve memory cells. Each block has one-hundred-and-twenty-eight main word lines (not shown) disposed in the horizontal direction across all four block sections. Each block section has one-hundred-twenty-eight sub-word decoders. A sub-word decoder (not shown) is electrically connected to a main word line and provides four sub-word lines (not shown) in the block section. This gives a total of five-hundred-and-twelve sub-word lines in a block section.

It can be seen from the bit map of FIG. 19, that any of the groups of blocks (XBLK0 to XBLK3; XBLK4 to XPLK7; XBLK8 to XBLK11; XBLK12 to XBLK15) is selected according to row address X11 and X12. Also, a block in a block group is selected according to row address X9 and X10.

One of the one-hundred-and-twenty-eight main word lines in a block (BLK0 to BLK15) is selected according to row address X2 to X8. A sub-word decoder selects one of four sub-word lines according to row address X0 and X1. In this example, the blocks are selected sequentially from block XBLK0 to block XBLK15 as the value of row addresses X9 to X12 (with X9 being the less significant address) increases.

When a block (XBLK0 to XBLK15) is selected according to row addresses (X9 to X12), a word line within the selected block can be activated according to row addresses X0 to X8. If a block (XBLK0 to XBLK15) is not selected, all word lines within the block are unselected.

For example, when X10 to X12 have a value (000), switching row address X9 from "0" to "1" switches between block XBLK0 to XBLK1.

Referring now to FIG. 20, a conventional block selector is set forth in a circuit schematic diagram and given the general reference character 800.

Conventional block selector 800 is used to select a block (XBLK0 to XBLK15) in the conventional sub-array illustrated in FIG. 19. Conventional block selector 800 has block predecoders (810 and 820) and a block decoder 830. Block predecoder 810 receives and decodes row address signals X9 and X10 and provides predecode signals XP10 to XP13 to block decoder 830. Block predecoder 820 receives and decodes row address signals X11 and X12 and provides predecode signals XP20 to XP23 to block decoder 830. Row address signals X9 to X12 are provided by an address generator, such as illustrated in FIG. 10, which will be described later. Block decoder receives predecode signals (XP10 to XP13 and XP20 to XP23) and provides a block select signal to each block (XBLK0 to XBLK15).

Block decoder 830 has sixteen AND gates (8301 to 8316). Each AND gate (8301 to 8316) receives a unique combination of predecode signals (XP10 to XP13) from block predecoder 810 and predecode signals (XP20 to XP23) from block predecoder 820. Only one of the four predecode signals (XP10 to XP13) is activated and only one of the four predecode signal (XP20 to XP23) is activated. Thus, only one AND gate (8301 to 8316) has an active output and selects one of sixteen blocks (XBLK0 to XBLK15).

Referring now to FIG. 21, a block predecoder is set forth in a circuit schematic diagram. The block predecoder of FIG. 21 can be used as block predecoder (810 or 820) in the conventional block selector 800 with references to block predecoder 820 shown in parenthesis.

Block predecoder 810 has inverters (8101 to 8104), NAND gates (8105 to 8108), and inverters (8109 to 8112). Inverters (8101 and 8103) are used for inverting row address X9, and inverters (8102 and 8104) are used for inverting row address X10. NAND gates (8105 to 8108) each receive a unique combination of row address (X9 and X10) and/or inverted row addresses (X9 and X10) and provide a predecode signal (XP10 to XP13) by way of inverters (8109 to 8112) respectively.

For block predecoder 810, in accordance with the logic values of row addresses (X9 and X10) one of the predecode signals (XP10 to XP13) have a logic value of one, while the other predecode signals (XP10 to XP13) has a logic value of zero. Thus, one of the four (one-quarter) predecode signals (XP10 to XP13) is selected. Similarly for block predecoder 820, in accordance with the logic values of row addresses (X11 and X12), one of the predecode signals (XP20 to XP23) has a logic value of one, while the other predecode signals (XP20 to XP23) have a logic value of zero. Thus, one of the four (one-quarter) predecode signals (XP20 to XP23) is selected.

A conventional block selection operation will now be explained.

An address generator, such as address generator 500 illustrated in FIG. 10, receives external addresses (A0 to Aj) and latches the value of the external address in latching circuits (503-0 to 503-*j*) synchronously with and external clock CLK. At this time, based on the value of a row address strobe signal RASB, the latched address values are latched in row address latching circuits (504-0 to 504-*j*) and provide row addresses (X0 to Xj).

Row addresses, such as X13 and X14, are used to select a bank, which will be described later. Row addresses (X9 to X12) are applied to block selector 800 to select a block (BLK0 to BLK15) as described earlier. Row addresses (X0 to X8) are applied to a row decoder (not shown) and used in selecting a main word line and sub-word line as described earlier. Data bits from memory cells connected to selected sub-word lines are then latched in sense amplifiers.

After a predetermined time period (tRCD) after the row addresses (X0 to Xj) were latched, newly applied external address signals (A0 to Aj) are latched in column address latching circuits (505-0 to 505-*j*) as column addresses (Y0 to Yj). This is done in the same general manner as the latching of the row addresses (X0 to Xj) except the column addresses (Y0 to Yj) are latched based on the value of a column address strobe signal CASB. At this time, a sense amplifier or group of sense amplifiers may be selected, based on the column address (Y0 to Yj).

In this way, data is read or written from/to selected memory cells.

In the above conventional case, the block (BLK0 to BLK15) is selected based on row addresses X9 to X12. The row within the selected block is selected based on row addresses X0 to X8. Both the number of blocks (sixteen) and the number of rows (five-hundred-and-twelve) with a block are powers of two ($2^n$, where n is an integer). In the conventional example mentioned above, the memory cell array is divided into two to the fourth power (sixteen) blocks (BLK0 to BLK15).

The reason for dividing the memory cell array into a plurality of blocks is to reduce the number of memory cells connected to one bit line, so that the capacitance ratio (Cd/Cs) is maintained. However, as the memory capacity is made larger, the number of blocks increase further, which can lead to an increased chip size. On the other hand, if the number of blocks is kept the same as the memory capacity is made larger, the capacitance ratio (Cd/Cs) is increased and reading errors may occur. If the capacitance ratio is set to a maximum allowable capacitance ratio (Cd/Cs), the blocks may not be divided evenly into a power of two and would complicate the decoding and may increase the time to select blocks and word lines.

In view of the above discussion, it would be desirable to provide a semiconductor memory device having a method for setting the number of blocks to a number other than a power of two. It would also be desirable to provide a method of selecting blocks when the number of blocks is a number other than a power of two. It would also be desirable to provide the above without unduly complicating the block selection and increasing selection time.

SUMMARY OF THE INVENTION

According to the present embodiments, a semiconductor memory device can include a memory cell array. The memory cell array can be divided into a number of blocks that is not a factor of two. The blocks may be arranged into repeated groups of blocks.

According to one aspect of the embodiments, each block group may include an uneven number of blocks.

According to one another aspect of the embodiments, a group of blocks may include a center block. The group of blocks may have a bit map that is symmetrical around a center of the center block.

According to another aspect of the embodiments, the semiconductor memory device may include a block selector coupled to receive addresses and select a block.

According to another aspect of the embodiments, the block selector can include a block predecoder for providing select signals for selecting a group of blocks.

According to another aspect of the embodiments, the block selector can include a block predecoder for providing select signals for selecting a block from a group of blocks.

According to another aspect of the embodiments, the plurality of blocks may be addressable by a plurality of addresses and at least one higher order address may select one of the plurality of block groups.

According to another aspect of the embodiments, a first block from the plurality of blocks may have fewer rows than a second block from the plurality of blocks.

According to another aspect of the embodiments, a first block from the plurality of blocks may include normal rows and filler rows. A second block from the plurality of blocks may include normal rows, and the number of normal rows in the second block may equal the number of normal rows plus filler rows in the first block.

According to another aspect of the embodiments, the filler rows may be redundant rows that can be used to replace a normal row.

According to another aspect of the embodiments, the block selector may include a plurality of block decoders, each block decoder may receive a block select signal from a first predecoder and a block group select signal from a second predecoder.

According to another aspect of the embodiments, an address generator may include row address latching circuits for latching row addresses and column address latching circuits for latching column addresses.

According to another aspect of the embodiments, the address generator may also include block address latching circuits for latching block addresses. Each block address latching circuit may include an exclusive OR function.

According to another aspect of the embodiments, block addresses may be supplied to a block decoder. Row addresses may be supplied to a row decoder. The block addresses may provide a symmetrical bit map. The row addresses may provide a non-symmetrical bit map.

According to another aspect of the embodiments, the semiconductor memory device may be a dynamic random access memory (DRAM) having a memory cell including a cell transistor and cell capacitor. The memory cell may be coupled to a bit line having a bit line capacitance. The number of blocks may be determined by a ratio of the capacitance of the bit line and the capacitance of the cell capacitor. The DRAM may be a synchronous DRAM (SDRAM).

BRIEF DESCRIPTION OF THE DRAWINGS

FIG. 15 is a bit map illustrating the block mapping according to the block predecoder of FIG. 14.

FIG. 18A is a bit map of block addressing according to an embodiment.

FIG. 18B is a bit map of selected addresses for word line addressing according to the an embodiment.

DETAILED DESCRIPTION OF THE EMBODIMENTS

Various embodiments of the present invention will now be described in detail with reference to a number of drawings.

Figure 1:
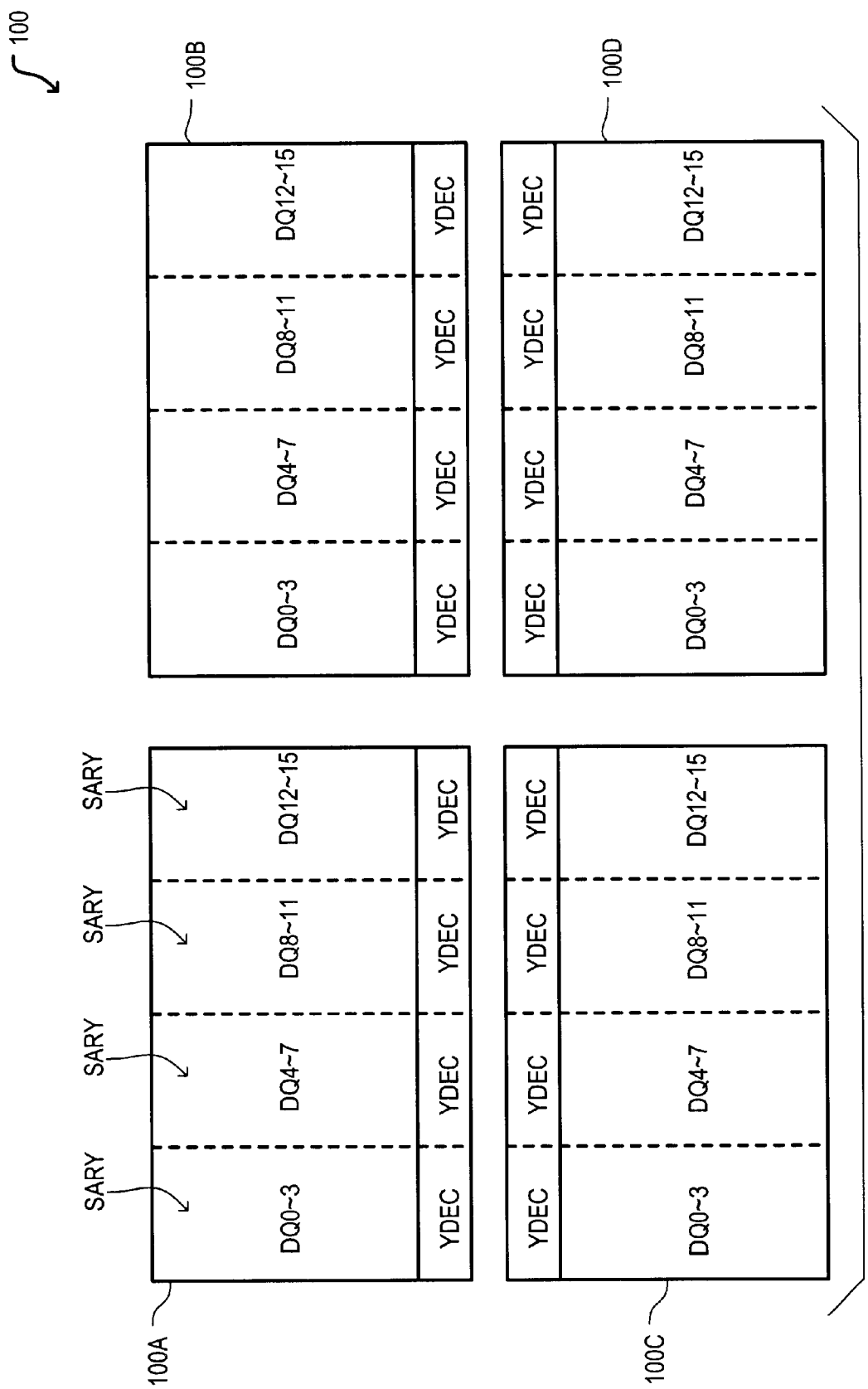
FIG. 1 is a block schematic diagram of a semiconductor memory device according to one embodiment.

Referring now to FIG. 1, a block schematic diagram of a semiconductor memory device according to one embodiment is set forth and given the general reference character 100. Semiconductor memory device can be a 256 M-bit SDRAM. Semiconductor memory device 100 may include four banks (100A to 100D). Each bank can have a memory density of 64 M-bits and may be divided into four sub-arrays SARY. Each bank can provide 16 bits of data onto the external data pins (DQ0 to DQ15). The 16 bits of data may be divided into four groups. DQ0 to DQ3 can form one group of data. DQ4 to DQ7, DQ8 to DQ11, and DQ12 to DQ15, respectively, may form the other groups. Each sub-array SARY may store bits from one group of data.

Row and column addresses may be applied to the sub-arrays SARY and 16 bits of data (DQ0 to DQ15) may be read and written in parallel.

Figure 2A:
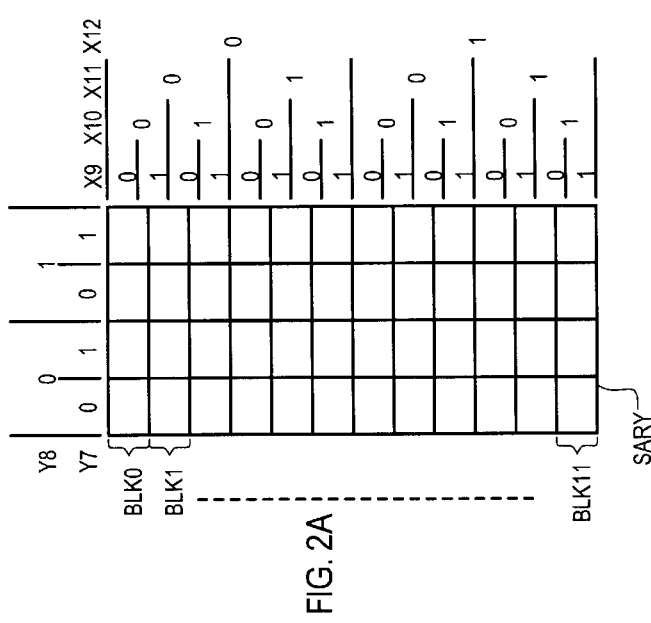
FIG. 2A is a bit map illustrating the sub-array configuration in the embodiment of FIG. 1.
Figure 2B:
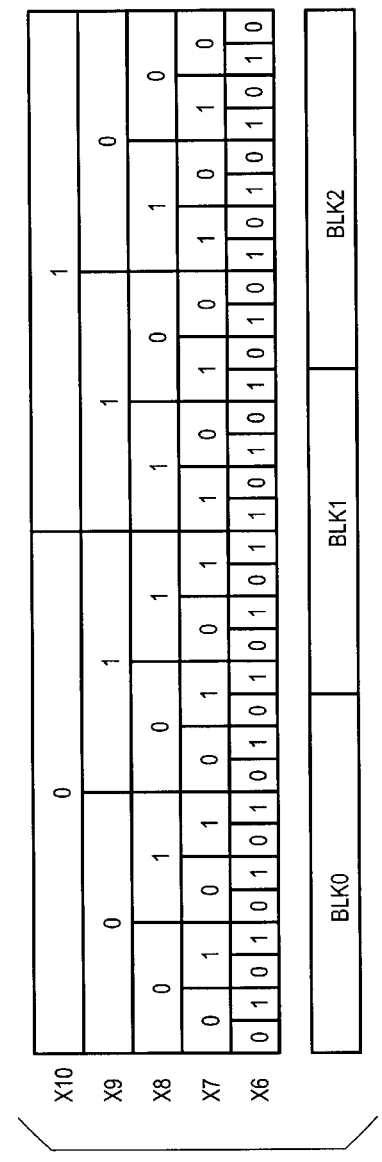
FIG. 2B is a bit map illustrating the configuration of a group of blocks in the embodiment of FIG. 1.

Referring now to FIGS. 2A and 2B, the sub-array configuration and address bit map according to one embodiment are illustrated.

FIG. 2A can illustrate the configuration of a sub-array SARY in FIG. 1. Sub-array SARY can be divided into a number of blocks (BLK0 to BLK11), which is not a power of two (twelve blocks). The number of blocks may be determined by a minimum number to achieve a desired capacitance ratio (Cd/Cs), which may allow reliable sensing of data stored in a memory cell. Cd may be the parasitic capacitance value of a bit line and Cs may be a capacitance value of a memory cell capacitor.

In the example illustrated in FIG. 2A, the number of blocks (BLK0 to BLK11) can be less than 16 (2 to the fourth power) and greater than 8 (2 to the third power). For example, when the number of blocks is 8, the capacitance ratio (Cd/Cs) may be too large to allow sufficient sense margin. When the number of blocks is 16, the capacitance ratio (Cd/Cs) may be small enough to allow sufficient sensing margin, but the chip size may be increased (as compared to the example in which there are 12 blocks (BLK0 to BLK11).

FIG. 2A can also illustrate an address bit map for row addresses (X9 to X12) showing how row addresses (X9 to X12) may be mapped into the sub-array SARY for selecting a block (BLK0 to BLK11). Each block (BLK0 to BLK11) may be divided into four block sections. FIG. 2A can also illustrate an address bit map for column addresses (Y7 and Y8) showing how column addresses (Y7 and Y8) may be mapped into each block (BLK0 to BLK11) to select a block section.

Each block (BLK0 to BLK11) may have bit lines disposed in the column direction and word lines disposed in the row direction. Each block (BLK0 to BLK11) may also have sense amplifier circuits. A block (BLK0 to BLK11) may be selected with row addresses (X6 to X12) and the memory cell array may be partially activated in block units.

Figure 19:
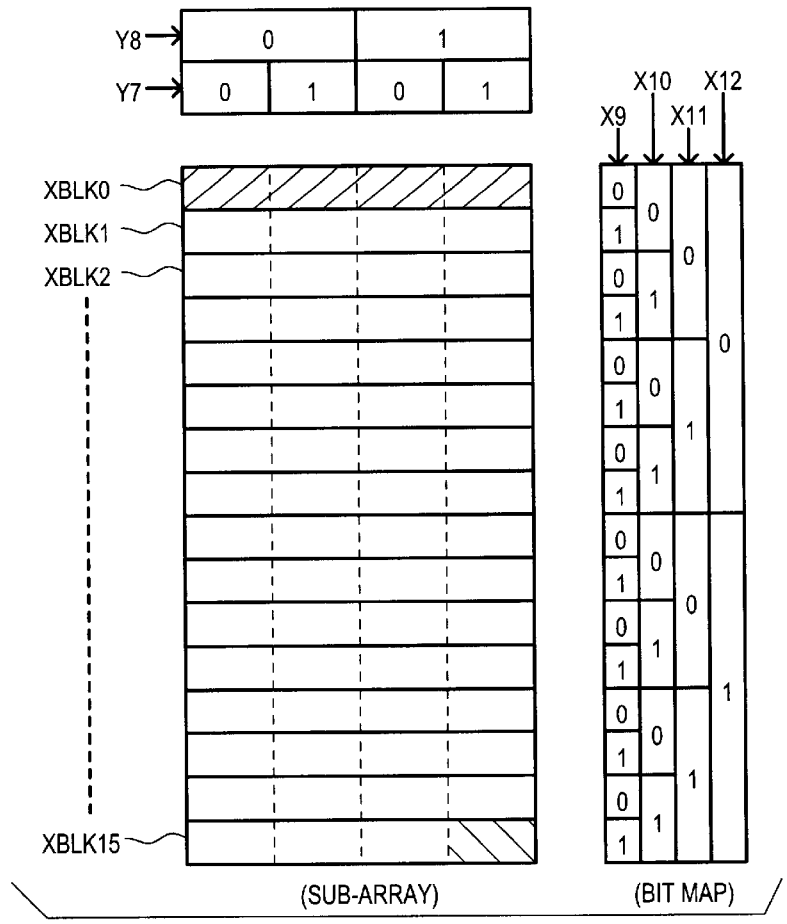
FIG. 19 is a bit-map illustrating the address mapping of a conventional sub-array.
Figure 21:
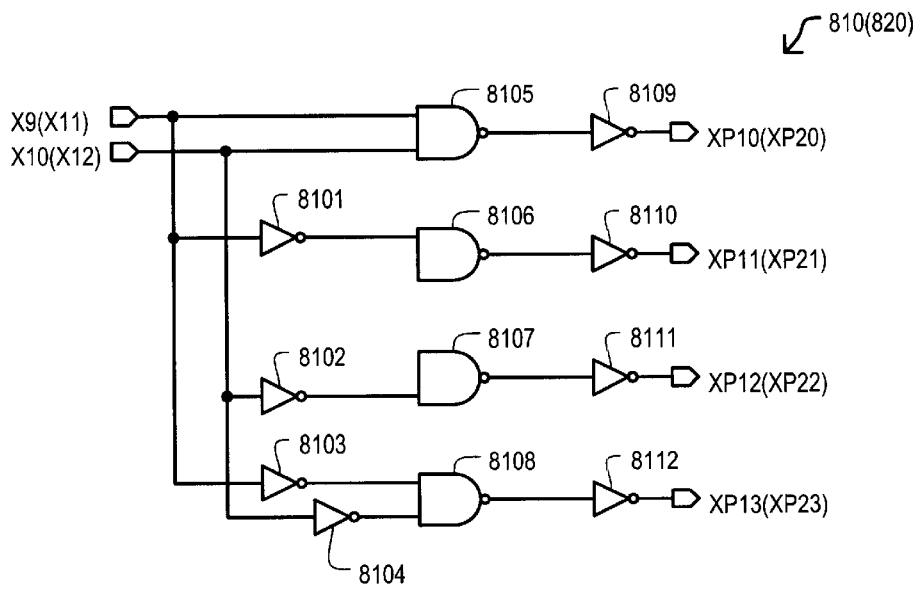
FIG. 21 is a circuit schematic diagram of a conventional block predecoder.
Figure 20:
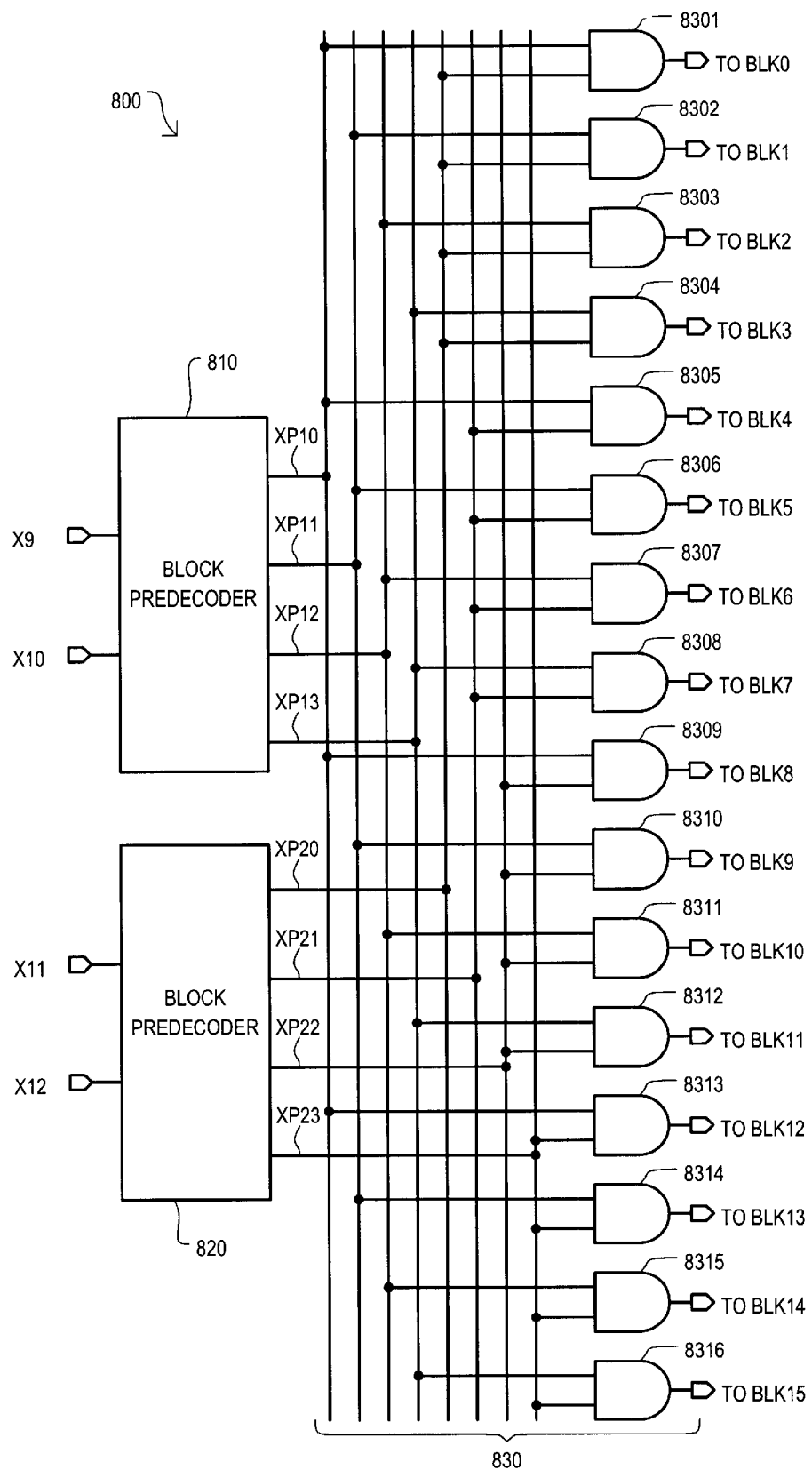
FIG. 20 is a circuit schematic diagram of a conventional block selector.

It can be seen in FIG. 2A, that the boundary of a block (BLK0 to BLK11) may not be defined by a transition of a more significant row address (for example X9) as was the case in the conventional sub-array illustrated in FIG. 19.

Referring now to FIG. 2B, the bit map of row addresses (X6 to X10) are illustrated for blocks (BLK0 to BLK2). It can be seen in FIG. 2B that a block boundary may be determined when a less significant address (for example X6) transitions. Blocks (BLK0 to BLK2) may have symmetrical address maps around the transition of row address X10. At the point in the bit map where row address X10 transitions from a zero to a one, the bit map may form a mirror image with respect to row addresses (X6 to X9). Thus, three blocks having the same bit map with respect to row addresses (X6 to X9) may be repeated 4 times to form blocks (BLK0 to BLK11) in sub-array SARY.

In the embodiment illustrated in FIG. 2A and FIG. 2B, a "center of the block" can signify an interface where a logic value of a row address signal may divide rows belonging to the block. In this way, row address X10 may indicate the center of block BLK1. Thus, BLK1 may be used as a center block for a repeated group of blocks (BLK0 to BLK2). A repeated group of blocks may be an odd number of blocks. A bit map of row addresses that are less significant then the dividing row address may be arranged so that a bit map on one side of a center of a center block may be a mirror image of a bit map on the other side of a center of a center block.

In the example illustrated in FIG. 2B, block BLK0 may have boundaries defined by the region of row addresses (X6, X7, X8, X9, and X10) having values from address (0, 0, 0, 0, 0) to address (0, 1, 0, 1, 0). Block BLK0 may be divided into eleven regions in which a region may be defined by transitions of the least significant block address (row address X6). BLK1 may be defined by the regions of row addresses (X6, X7, X8, X9, and X10) having values from address (1, 1, 0, 1, 0) to address (1, 1, 1, 1, 0) and address (1, 1, 1, 1, 1) to address (1, 1, 0, 1, 1). BLK1 may be divided into ten regions. BLK2 may be defined by the region of row addresses (X6, X7, X8, X9, and X10) having values from address (0, 1, 0, 1, 1) to address (0, 0, 0, 0, 1). BLK2 may be divided into eleven regions.

Each region may have sixty-four rows and blocks (BLK0 and BLK2) may each be divided into eleven regions. Thus, block BLK0 and block BLK2 may each have 704 rows (64 rows×11 regions). The number of rows in block BLK1 may be 640 rows (64 rows×10 regions).

In this example, an imbalance of sixty-four rows may be created between the two side blocks (BLK0 and BLK2) and the center block (BLK1) in the repeated group of blocks (BLK0 to BLK2). Thus, there may be a difference in the capacitance ratio (Cd/Cs) between these blocks. However, the worst-case blocks (in this case BLK0 and BLK2) may have a capacitance ratio (Cd/Cs) that can allow sufficient sense margins.

The imbalance may be reduced by adding a lower significant row address signal for selecting a block (BLK0 to BLK11). For example, when row address signal X5 is added, the imbalance in the number of rows per block may be reduced from sixty-four rows to thirty-two rows.

Figure 3:
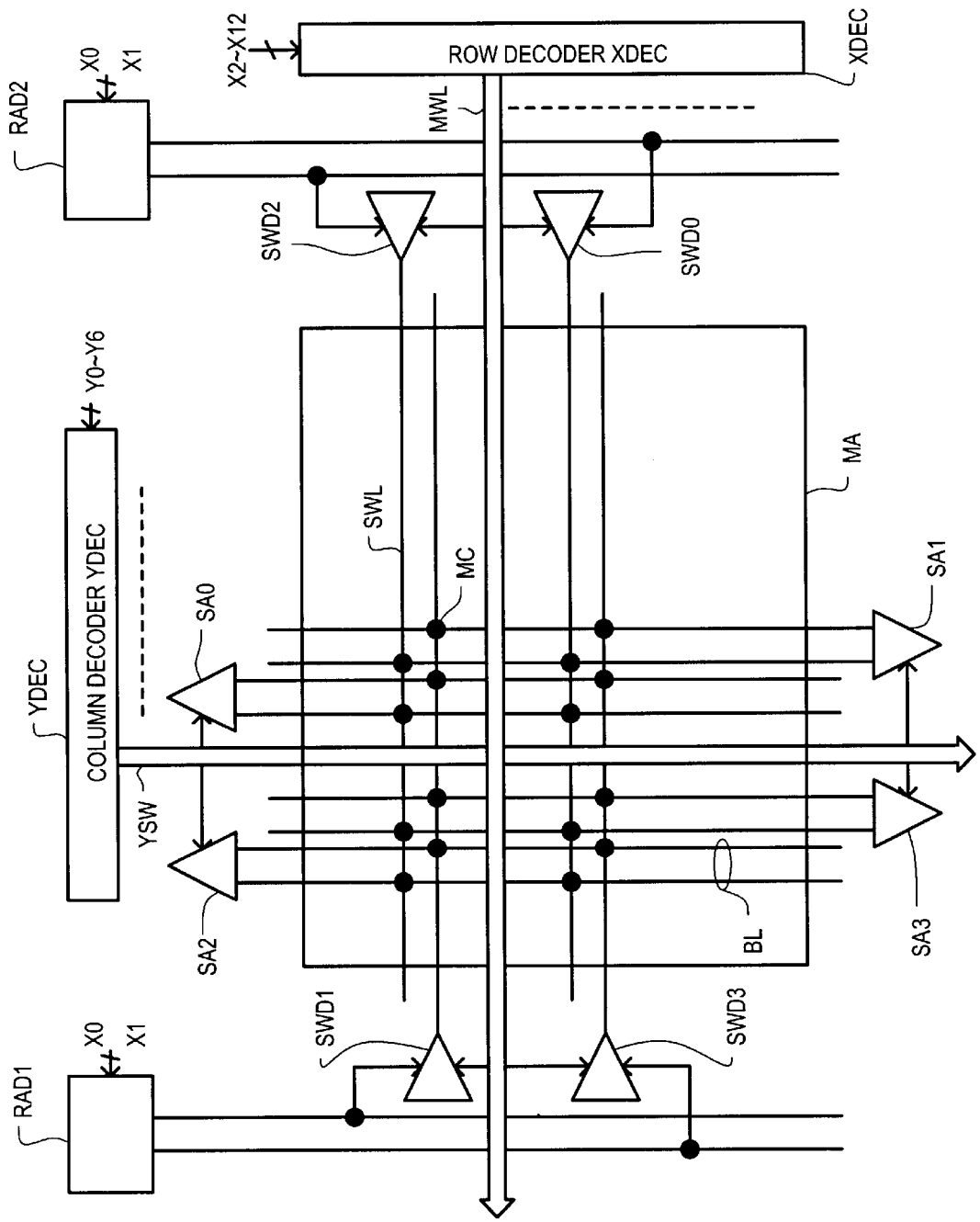
FIG. 3 is a schematic diagram of a portion of a block according to one embodiment.

Referring now to FIG. 3, a schematic diagram of a portion of a block according to one embodiment is set forth.

The portion of a block BLKn may include a memory cell array MA. Memory cell array MA may correspond to a block section in the sub-array of FIG. 2A. This can be a one-quarter section of a block (BLK0 to BLK11).

A row decoder XDEC may receive row addresses (X2 to X12) and may activate a main word line MWL. Sub-word decoders (SWD0 to SWD3) may receive a main word line MWL from a row decoder XDEC. Sub-word decoders (SWD0 to SWD3) may activate a sub-word line SWL based on the logic state of the receive main word line MWL and row addresses (X0 and X1) decoded by a row address driver (RAD0 and RAD1). Sub-word lines SWL may be disposed in a row direction in memory cell array MA.

A column decoder YDEC may receive column addresses (Y0 to Y6) and may activate a column selection line YSW. Column selection line may select sense amplifiers (SA0 to SA3). Sense amplifiers (SA0 to SA3) may be electrically connected to memory cells MC via bit lines BL. In this way, data may be read/written from/to memory cells MC in memory cell array MA. Memory cells MC may be formed at predetermined points of intersection between bit lines BL and sub-word lines SWL. If memory array MA is located in block BLK0, the four selected sense amplifiers (SA0 to SA3) may provide data (DQ0 to DQ3), as just one example.

Column selection lines YSW may be disposed in a column direction across blocks (BLK0 to BLK11) in a sub-array. Main word lines MWL may be disposed in a row direction across a block (BLK0 to BLK11).

A sense amplifier SA may be provided for each bit line BL within a memory cell array MC. A block selection may signify that sense amplifiers SA within a selected block (BLK0 to BLK11) may be activated.

Figure 4:
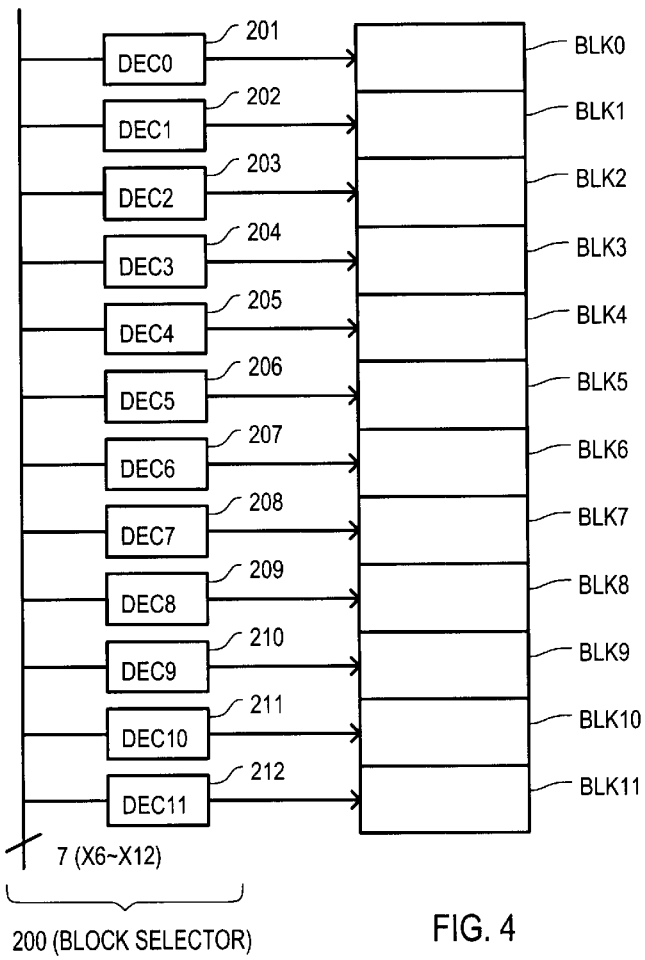
FIG. 4 is a block selector according to one embodiment.

Referring now to FIG. 4, a block selector according to one embodiment is set forth and given the general reference character 200.

Block selector 200 may be used to select blocks (BLK0 to BLK11) in the embodiment disclosed in FIG. 2A. Block selector 200 can include decoders (201 to 212). Decoders (201 to 212) may receive row addresses (X6 to X12) and may select a block (BLK0 to BLK11) based on the value of the row addresses (X6 to X12).

Because a group of blocks (for example BLK0 to BLK3) may have the same general decoding structure as groups of blocks (BLK4 to BLK7 and BLK8 to BLK11), decoders (201, 204, 207, and 210) may have the same general configuration. Decoders (202, 205, 208, and 211) may have the same general configuration. Decoders (203, 206, 209, and 212) may have the same general configuration. Decoders (201, 204, 207, and 210) may be referred to as decoder DEC0. Decoders (202, 205, 208, and 211) may be referred to as decoder DEC1. Decoders (203, 206, 209, and 212) may be referred to as decoder DEC2.

Figure 5A:
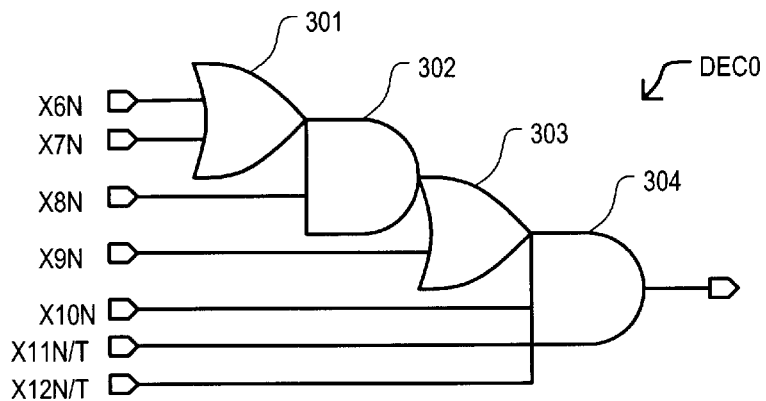
FIGS. 5A, 5B, and 5C are logic circuit schematic diagrams of decoders according to an embodiment.
Figure 5B:
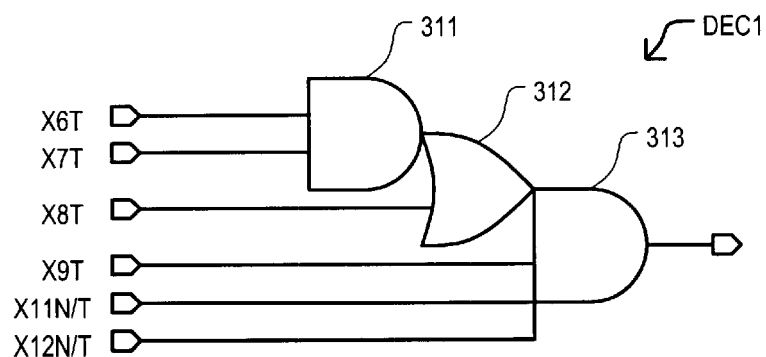
Figure 5C:
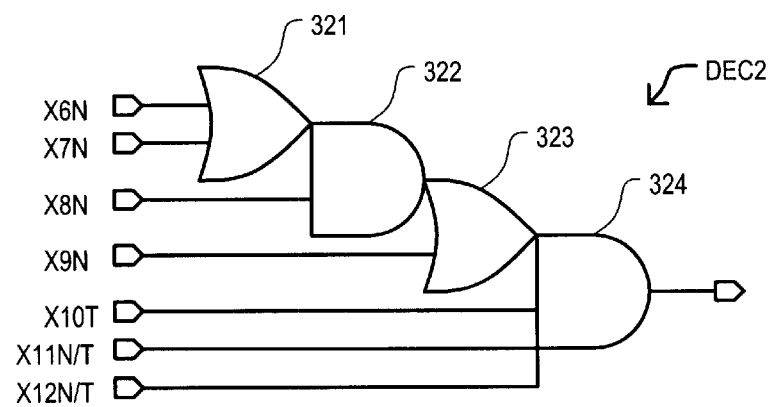

Referring now to FIGS. 5A to 5C, logic circuit schematic diagrams of decoders according to an embodiment are set forth.

FIG. 5A illustrates decoder DEC0. FIG. 5B illustrates decoder DEC1. FIG. 5C illustrates decoder DEC2.

In the decoders (DEC0 to DEC2) illustrated in FIGS. 5A-5C, row addresses are appended with a "T" (indicating positive logic), an "N" (indicating negative logic), or a "N/T." For example, X6N can be logic one when row address X6 is logic zero, thus X6N may be row address X6 inverted. X6T can be logic one when row address X6 is logic one, thus X6T may correspond to row address X6 not inverted. Also, X12N/T may be either positive logic or negative logic depending on which group of blocks (BLK0 to BLK2, BLK3 to BLK5, BLK6 to BLK8, BLK9 to BLK11) the particular block may be located.

Referring now to FIG. 5A, decoder DEC0 can include an OR gate 301, an AND gate 302, an OR gate 303 and an AND gate 304. Row address signals X6N and X7N may be input to OR gate 301. The output of OR gate 301 and row address signal X8N may be input to AND gate 302. The output of AND gate 302 and row address signal X9N may be input to OR gate 303. The output of OR gate 303, row address signals X10N, X11N/T, and X12N/T may be input to AND gate 304. The output of AND gate 304 may be used as a block selection signal. Decoder DEC0 may provide an output of AND gate 304, which can respond to select block BLK0 according to the bit map illustrated in FIG. 2B.

Referring now to FIG. 5B, decoder DEC1 can include an AND gate 311, an OR gate 312, and an AND gate 313. Row address signals X6T and X7T may be input to AND gate 311. The output of AND gate 311 and row address signal X8T may be input to OR gate 312. The output of OR gate 312 and row address signals X9T, X11N/T, and X12N/T may be input to AND gate 313. The output of AND gate 313 may be used as a block selection signal. Decoder DEC1 may provide an output of AND gate 313, which can select block BLK1 according to the bit map illustrated in FIG. 2B.

Referring now to FIG. 5C, decoder DEC2 can include an OR gate 321, an AND gate 322, an OR gate 323 and an AND gate 324. Row address signals X6N and X7N may be input to OR gate 321. The output of OR gate 321 and row address signal X8N may be input to AND gate 322. The output of AND gate 322 and row address signal X9N may be input to OR gate 323. The output of OR gate 323, row address signals X10T, X11N/T, and X12N/T may be input to AND gate 324. The output of AND gate 324 may be used as a block selection signal. Decoder DEC2 may provide an output of AND gate 324, which can be used to select block BLK2 according to the bit map illustrated in FIG. 2B.

As noted above, X11N/T and X12N/T may be either positive logic or negative logic depending on which group of blocks (BLK0 to BLK2, BLK3 to BLK5, BLK6 to BLK8, BLK9 to BLK11) the particular block may be located. For example, if decoder (DEC0 to DEC2) is used in the group of blocks (BLK0 to BLK2), then decoder (DEC0 to DEC3) may receive X11N and X12N. If decoder (DEC0 to DEC2) is used in the group of blocks (BLK3 to BLK5), then decoder (DEC0 to DEC3) may receive X11T and X12N. If decoder (DEC0 to DEC2) is used in the group of blocks (BLK6 to BLK8), then decoder (DEC0 to DEC3) may receive X11N and X12T. If decoder (DEC0 to DEC2) is used in the group of blocks (BLK9 to BLK11), then decoder (DEC0 to DEC3) may receive X11T and X12T.

Decoders (DEC0 to DEC3) illustrated in FIGS. 5A to 5C may be used to when a bit map is symmetrically folded in a center of a group of blocks (BLK0 to BLK2 in FIG. 2B).

Figure 6A:
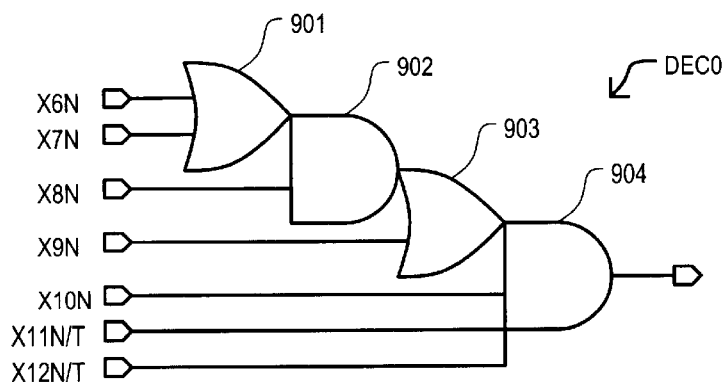
FIGS. 6A, 6B, and 6C are logic circuit schematic diagrams of decoders according to an embodiment.
Figure 6B:
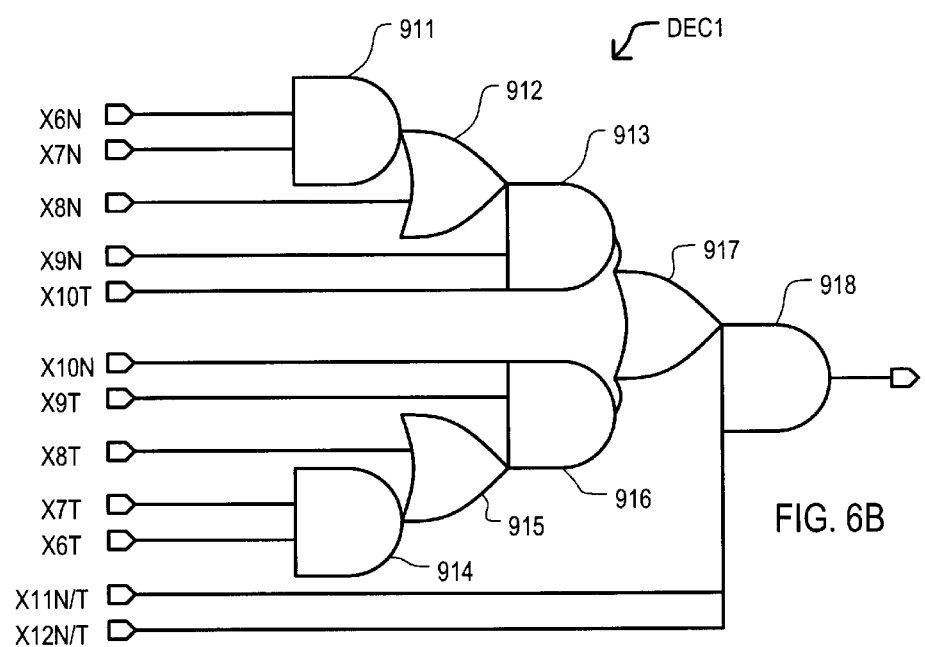
Figure 6C:
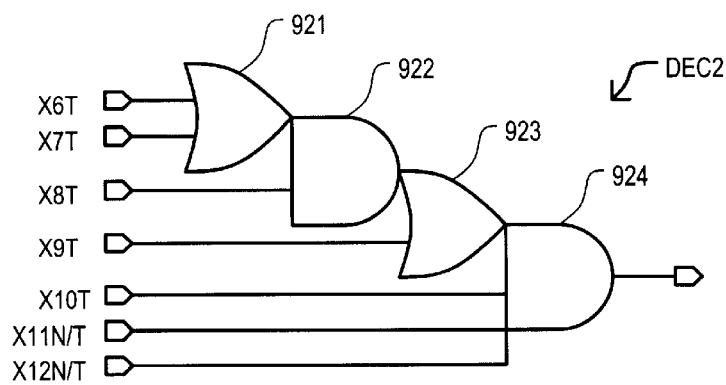

Referring now to FIGS. 6A to 6C, logic circuit schematic diagrams of decoders according to an embodiment is set forth.

FIGS. 6A to 6C may be used when to decode block selection according to a conventional bit map. A conventional bit map can be illustrated in FIG. 9B. A conventional bit map may consecutively increment the address. In this way, a conventional bit map may not form a mirror image for address bits.

FIG. 6A illustrates decoder DEC0. FIG. 6B illustrates decoder DEC1. FIG. 6C illustrates decoder DEC2.

Referring now to FIG. 6A, decoder DEC0 can include an OR gate 901, an AND gate 902, an OR gate 903 and an AND gate 904. Row address signals X6N and X7N may be input to OR gate 901. The output of OR gate 901 and row address signal X8N may be input to AND gate 902. The output of AND gate 902 and row address signal X9N may be input to OR gate 903. The output of OR gate 903, row address signals X10N, X11N/T, and X12N/T may be input to AND gate 904. The output of AND gate 904 may be used as a block selection signal. Decoder DEC0 may provide an output of AND gate 904, which can respond to select block BLK0 according to the conventional bit map illustrated in FIG. 9B.

Referring now to FIG. 6B, decoder DEC1 can include an AND gate 911, an OR gate 912, an AND gate 913, an AND gate 914, an OR gate 915, an AND gate 916, an OR gate 917, and an AND gate 918. Row address signals X6N and X7N may be input to AND gate 911. The output of AND gate 911 and row address signal X8N may be input to OR gate 912. The output of OR gate 912 and row address signals X9N and X10T may be input to AND gate 913. Row address signals X6T and X7T may be input to AND gate 914. The output of AND gate 914 and row address signal X8T may be input to OR gate 915. The output of OR gate 915 and row address signals X9T and X10N may be input to AND gate 916. The output of AND gate 913 and AND gate 916 may be input to OR gate 917. The output of OR gate 917 and row address signals X11N/T and X12N/T may be input to AND gate 918. The output of AND gate 918 may be used as a block selection signal. Decoder DEC1 may provide an output of AND gate 918, which can select block BLK1 according to the bit map illustrated in FIG. 9B.

Referring now to FIG. 6C, decoder DEC2 can include an OR gate 921, an AND gate 922, an OR gate 923 and an AND gate 924. Row address signals X6T and X7T may be input to OR gate 921. The output of OR gate 921 and row address signal X8T may be input to AND gate 922. The output of AND gate 922 and row address signal X9T may be input to OR gate 923. The output of OR gate 923, row address signals X10T, X11N/T, and X12N/T may be input to AND gate 924. The output of AND gate 924 may be used as a block selection signal. Decoder DEC2 may provide an output of AND gate 924, which can respond to select block BLK2 according to the conventional bit map illustrated in FIG. 9B.

As noted above, X11N/T and X12N/T may be either positive logic or negative logic depending on which group of blocks (BLK0 to BLK2, BLK3 to BLK5, BLK6 to BLK8, BLK9 to BLK11) the particular block may be located. For example, if decoder (DEC0 to DEC2) is used in the group of blocks (BLK0 to BLK2), then decoder (DEC0 to DEC3) may receive X11N and X12N. If decoder (DEC0 to DEC2) is used in the group of blocks (BLK3 to BLK5), then decoder (DEC0 to DEC3) may receive X11T and X12N. If decoder (DEC0 to DEC2) is used in the group of blocks (BLK6 to BLK8), then decoder (DEC0 to DEC3) may receive X11N and X12T. If decoder (DEC0 to DEC2) is used in the group of blocks (BLK9 to BLK11), then decoder (DEC0 to DEC3) may receive X11T and X12T.

Figure 7:
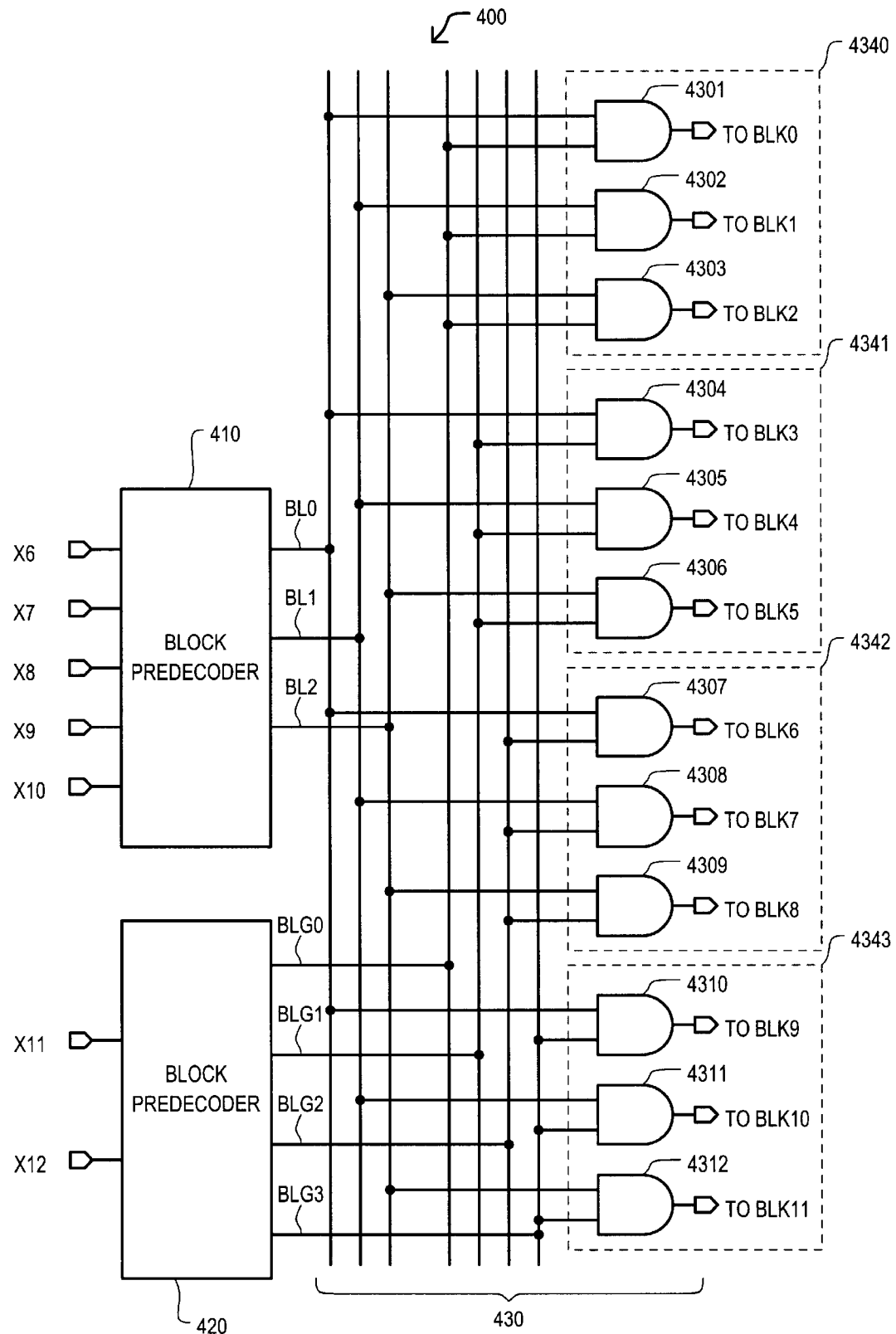
FIG. 7 is a schematic diagram of a block selector according to an embodiment.

Referring now to FIG. 7, a schematic diagram of a block selector according to another embodiment is set forth and given the general reference character 400.

Block selector 400 can include block predecoder 410, block predecoder 420 and a block decoder 430.

Block predecoder 410 may receive row addresses (X6 to X10) and may provide predecode signals (BL0 to BL2) to block decoder 430. Predecode signals (BL0 to BL2) may select one of three blocks in a repeated group of blocks (BLK0 to BLK2, BLK3 to BLK5, BLK6 to BLK8, and BLK9 to BLK11).

Block predecoder 420 may receive row addresses (X11 and X12) and may provide block group select signals (BLK0 to BLG3) to block decoder 430.

Block decoder 430 may receive predecode signals (BL0 to BL2) and block group select signals (BLK0 to BLG3) and may provide a block select signal to each block (BLK0 to BLK11). Block decoder may include decode circuits (4301 to 4312). Decode circuits (4301 to 4312) may be AND gates. Decode circuits may be arranged into groups of decode circuits (4340 to 4343). Block group select signals (BLK0 to BLG3) may enable a group of decode circuits (4340 to 4343). Predecode signals (BL0 to BL2) may select one of three decode circuits (4301 to 4312) in a group of decode circuits (4340 to 4343). In this way, one block (BLK0 to BLK11) may be selected.

Figure 8A:
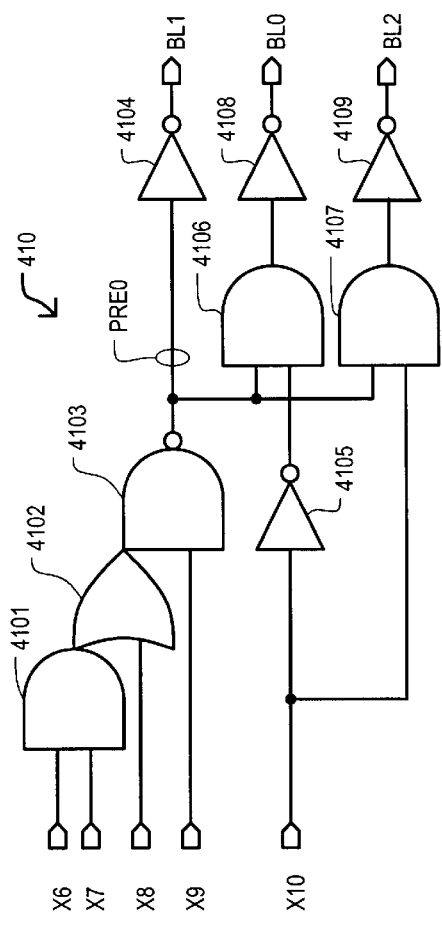
FIG. 8A is a logic schematic diagram of a block decoder according to an embodiment.

Referring now to FIG. 8A, a logic schematic diagram of block predecoder 410 according to one embodiment is set forth. Block predecoder 410 of FIG. 8A may be used as block predecoder 410 of FIG. 7.

Block predecoder 410 may include an AND gate 4101, an OR gate 4102, a NAND gate 4103, inverters (4104 and 4105), AND gates (4106 and 4107), and inverters (4108 and 4109). Row addresses (X6 and X7) may be input to AND gate 4101. The output of AND gate 4101 and row address X8 may be input to OR gate 4102. The output of OR gate 4102 and row address X9 may be input to NAND gate 4103. NAND gate 4103 may generate signal PRE0. Signal PRE0 may be input to inverter 4104. Inverter 4104 may generate predecode signal BL1. Row address X10 may be input to inverter 4105. The output of inverter 4105 and signal PRE0 may be input to AND gate 4106. The output of AND gate 4106 may be input to inverter 4108. Inverter 4108 may generate predecode signal BL0. Row address X10 and signal PRE0 may be input to AND gate 4107. The output of AND gate 4107 may be input to inverter 4109. Inverter 4109 may generate predecode signal BL2.

Figure 8B:
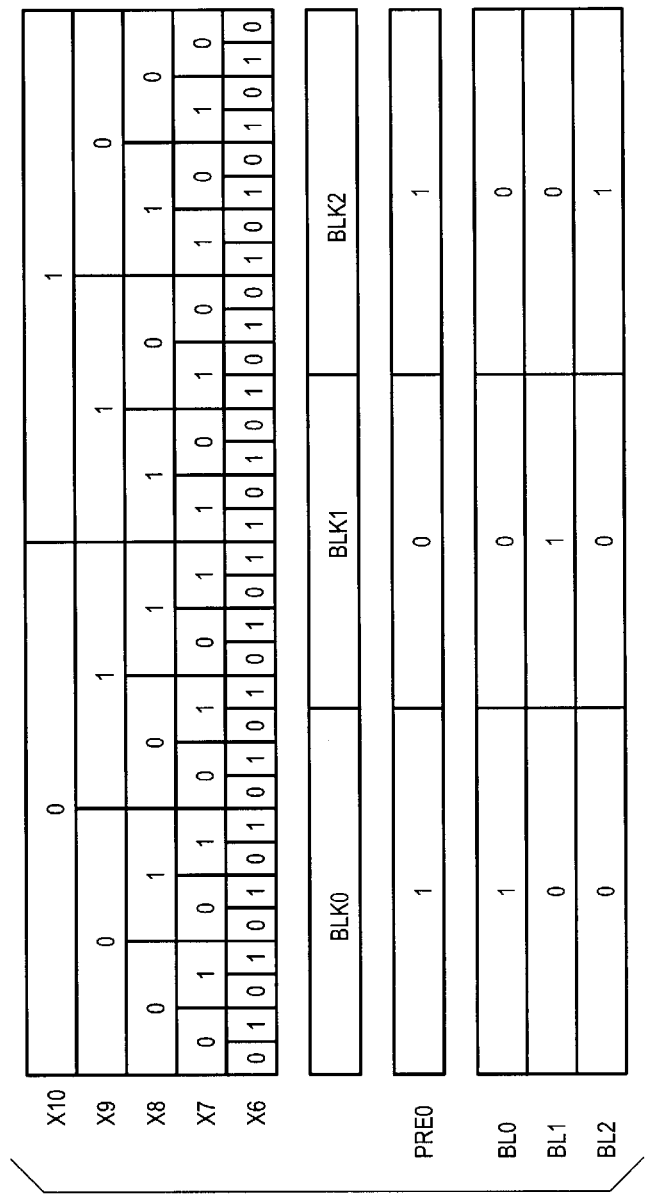
FIG. 8B is a bit map illustrating the block mapping according to an embodiment.

Referring now to FIG. 8B, a bit map of row addresses (X6 to X10) for generating predecode signals (BL0 to BL2) is set forth. The bit map of FIG. 8B also illustrates the generation of signal PRE0.

Block predecoder 410 illustrated in FIG. 8A may generate predecode signals (BL0 to BL2) according to the bit map illustrated in FIG. 8B.

As noted earlier, blocks (BLK0 to BLK2) may form a group of blocks that are repeated as far as the bit mapping of row addresses (X6 to X10) is concerned. Block BLK1 may form a center block, which may have a center in which the bit map may form a mirror image with respect to row addresses (X6 to X9). Thus, end blocks (BLK0 and BLK2) may have identically mirrored bit maps with respect to row addresses (X6 to X9). The end blocks may be distinguished by row address X10. When signal PRE0 (generated from row addresses X6 to X9) is logic zero, predecode signal BL1 may be activated, selecting a center block BLK1 from a group of blocks. When signal PRE0 is logic one, either predecode signal BL0 or predecode signal BL2 may be activated depending on the value of row address X10. This may select an end block (BLK0 to BLK2) from a group of blocks.

Referring back to FIG. 7, block predecoder 420 may then select a group of blocks (BLK0 to BLK2, BLK3 to BLK5, BLK6 to BLK8, and BLK9 to BLK11) based on the value of row addresses (X11 and X12).

Figures 9A, 9B:
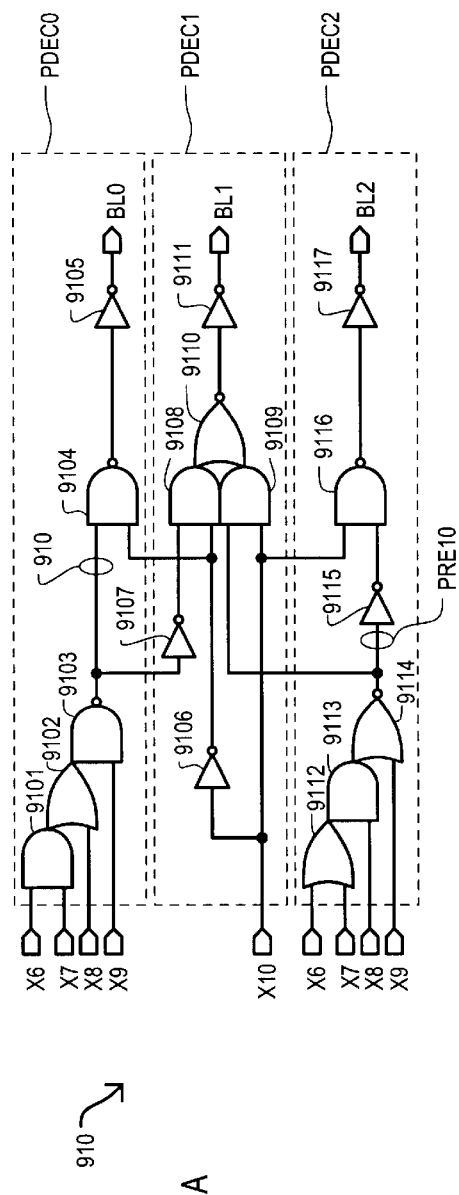
FIG. 9A is a logic schematic diagram of block predecoder according to one embodiment.
FIG. 9B is a bit map illustrating the block mapping according to an embodiment.

Referring now to FIG. 9A, a logic schematic diagram of block predecoder according to one embodiment is set forth and given the general reference character 910. Block predecoder 910 of FIG. 9A may be used as block predecoder 410 of FIG. 7 when a conventional bit map is used.

Block predecoder 910 may receive row addresses (X6 to X10) and my generate predecode signals (BL0 to BL2). Block predecoder 910 may include predecode circuits (PDEC0 to PDEC2).

Predecode circuit PDEC0 may include an AND gate 9101, an OR gate 9102, NAND gates (9103 and 9104) and an inverter 9105. Row addresses (X6 and X7) may be input to AND gate 9101. The output of AND gate 9101 and row address X8 may be input to OR gate 9102. The output of OR gate 9102 and row address X9 may be input to NAND gate 9103. NAND gate 9103 may generate signal PRE00. Signal PRE00 and row address X10 inverted by inverter 9106 may be input to NAND gate 9104. The output of NAND gate 9104 may be input to inverter 9105. Inverter 9105 may generate predecode signal BL0.

Predecode circuit PDEC1 may include inverters (9106 and 9107), AND gates (9108 and 9109), a NOR gate 9110, and an inverter 9111. Row address X10 may be input to inverter 9106. Signal PRE00 may be input to inverter 9107. The output of inverter 9106 and the output of inverter 9107 may be input to AND gate 9108. Row address X10 and signal PRE10 may be input to AND gate 9109. The output of AND gate 9108 and the output of AND gate 9109 may be input to NOR gate 9110. The output of NOR gate 9110 may be input to inverter 9111. Inverter 9111 may generate predecode signal BL1.

Predecode circuit PDEC2 may include an OR gate 9112, an AND gate 9113, a NOR gate 9114, an inverter 9115, a NAND gate 9116, and an inverter 9117. Row addresses (X6 and X7) may be input to OR gate 9112. The output of OR gate 9112 and row address X8 may be input to AND gate 9113. The output of AND gate 9113 and row address X9 may be input to NOR gate 9114. OR gate 9114 may generate signal PRE10. Signal PRE10 may be input to inverter 9115. The output of inverter 9115 and row address X10 may be input to NAND gate 9116. The output of NAND gate 9116 may be input to inverter 9117. Inverter 9117 may generate predecode signal BL2.

Referring now to FIG. 9B, a conventional bit map of row addresses (X6 to X10) for generating predecode signals (BL0 to BL2) with the block predecoder 910 is set forth. The conventional bit map of FIG. 9B also illustrates the generation of signals (PRE00 and PRE10).

When comparing FIGS. 9A and 8A, it can be seen that the logic of block predecoder 910 can be more complex than block predecoder 410. By using a non-conventional mirrored bit map as illustrated in FIG. 8B, logic complexity of block predecoder 410 may be reduced.

Figure 10:
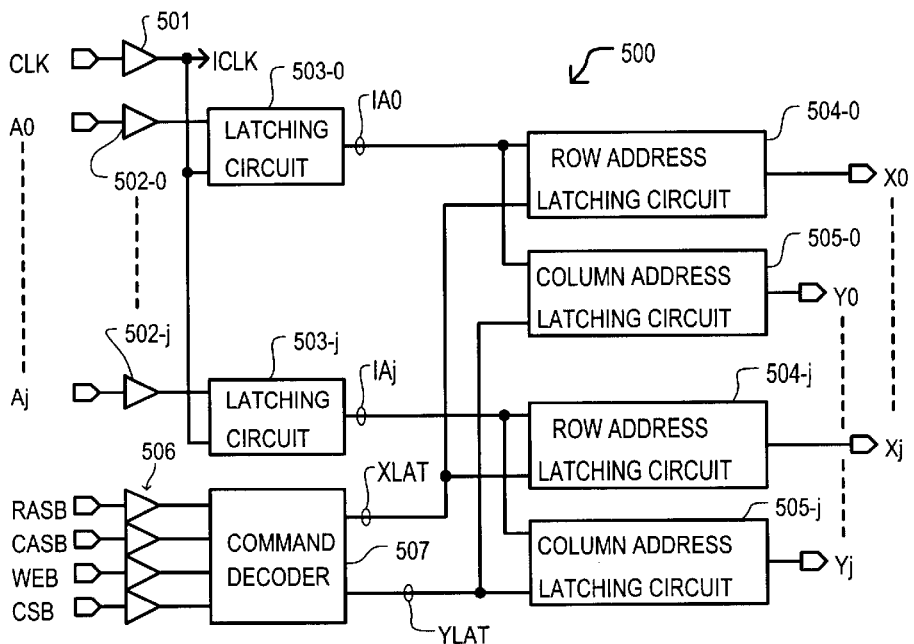
FIG. 10 is a block schematic diagram of an address generator according to an embodiment.

Referring now to FIG. 10, a block schematic diagram of an address generator according to an embodiment is set forth and given the general reference character 500.

Address generator 500 can receive external addresses (A0 to Aj), a clock signal CLK, and control signals (RASB, CASB, WEB, and CSB) and may generate row addresses (X0 to Xj) and column addresses (Y0 to Yj). Row addresses (X0 to Xj) and column addresses (Y0 to Yj) may be internal addresses used to select data bits. Control signals can include a row address strobe RASB, a column address strobe CASB, a write enable WEB, and a chip select CSB. Clock signal CLK can be an externally generated clock.

Address generator 500 can include first stage buffers (501, 502-0 to 502-j, and 506), a command decoder 507, latching circuits (503-0 to 503-j), row address latching circuits (504-0 to 504-j), and column address latching circuits (505-0 to 505-j).

First stage buffer 501 may receive clock signal CLK and may generate internal clock ICLK. First stage buffers (502-0 to 502-j) may receive external address signals (A0 to Aj), respectively. The output of first stage buffers (502-0 to 502-j) may be applied to latching circuits (503-0 to 503-j), respectively. Latching circuits (503-0 to 503-j) may also receive internal clock ICLK. Latching circuits (503-0 to 503-j) may provide an internal address (IA0 to IAj) to row address latching circuits (504-0 to 504-j), respectively. Latching circuits (503-0 to 503-j) may also provide internal address (IA0 to IAj) to column address latching circuits (505-0 to 505-j), respectively. Command decoder 507 may receive control signals (RASB, CASB, WEB, and CSB) and may provide a row address latch signal XLAT to row address latching circuits (504-0 to 504-j) and a column address latch signal YLAT to column address latching circuits (505-0 to 505-j). Row address latching circuits (504-0 to 504-j) may provide row addresses (X0 to Xj) as outputs. Column address latching circuits (505-0 to 505-j) may provide column addresses (Y0 to Yj) as outputs.

Address signals (A0 to Aj) may be received by first stage buffers (502-0 to 501-j) and may be latched by latching circuits (503-0 to 503-j) synchronously with internal clock ICLK. Command decoder 507 may determine whether the received address (A0 to Aj) is a row address or column address based on the logic level of control signals (RASB, CASB, WEB, and CSB). If command decoder 507 receives control signals (RASB, CASB, WEB, and CSB) having a combination indicating the received address (A0 to Aj) is a row address, row address latch signal XLAT may become active. When row address latch signal XLAT becomes active, row address latching circuits (504-0 to 504-j) may provide latched row addresses (X0 to Xj). If command decoder 507 receives control signals (RASB, CASB, WEB, and CSB) having a combination indicating the received address (A0 to Aj) is a column address, column address latch signal YLAT may become active. When column address latch signal YLAT becomes active, column address latching circuits (505-0 to 505-j) may provide latched row addresses (Y0 to Yj).

Row addresses (X6 to X12) may be applied to block select circuits illustrated in FIG. 4 and FIG. 7, as just two examples, and may be used for selecting blocks (BLK0 to BLK11).

Row addresses (X13 and X14) may be used to select banks (100A to 100D) as illustrated in FIG. 1. Row addresses (X0 to X12) may be predecoded and applied to row decoder XDEC as illustrated in FIG. 3.

Referring once again to FIGS. 2A and 2B, row addresses (X6 to X10) may be used to select one of a group of blocks (BLK0 to BLK2). The group of blocks may have a bit map that is mirrored around a center of a center block BLK1. When row addresses (X6 to X10, with X10 being the most significant bit) are sequentially incremented from (0, 0, 0, 0, 0) block BLK0 may be selected. When row addresses (X6 to X10) reach a value of (1, 1, 0, 1, 0) block BLK1 may be selected. Then when row addresses (X6 to X10) reach a value of (1, 1, 1, 1, 0), the bit map may be at the portion just to the left side of the center of center block BLK1. When row addresses (X6 to X10) increment one more time giving a value of (0, 0, 0, 0, 1) the bit map may jump to the right side of side block BLK2. As the row addresses (X6 to X10) increase, the bit map location moves incrementally to the left until the right side of the center of center block BLK1 is reached at (1, 1, 1, 1, 1).

Figure 11:
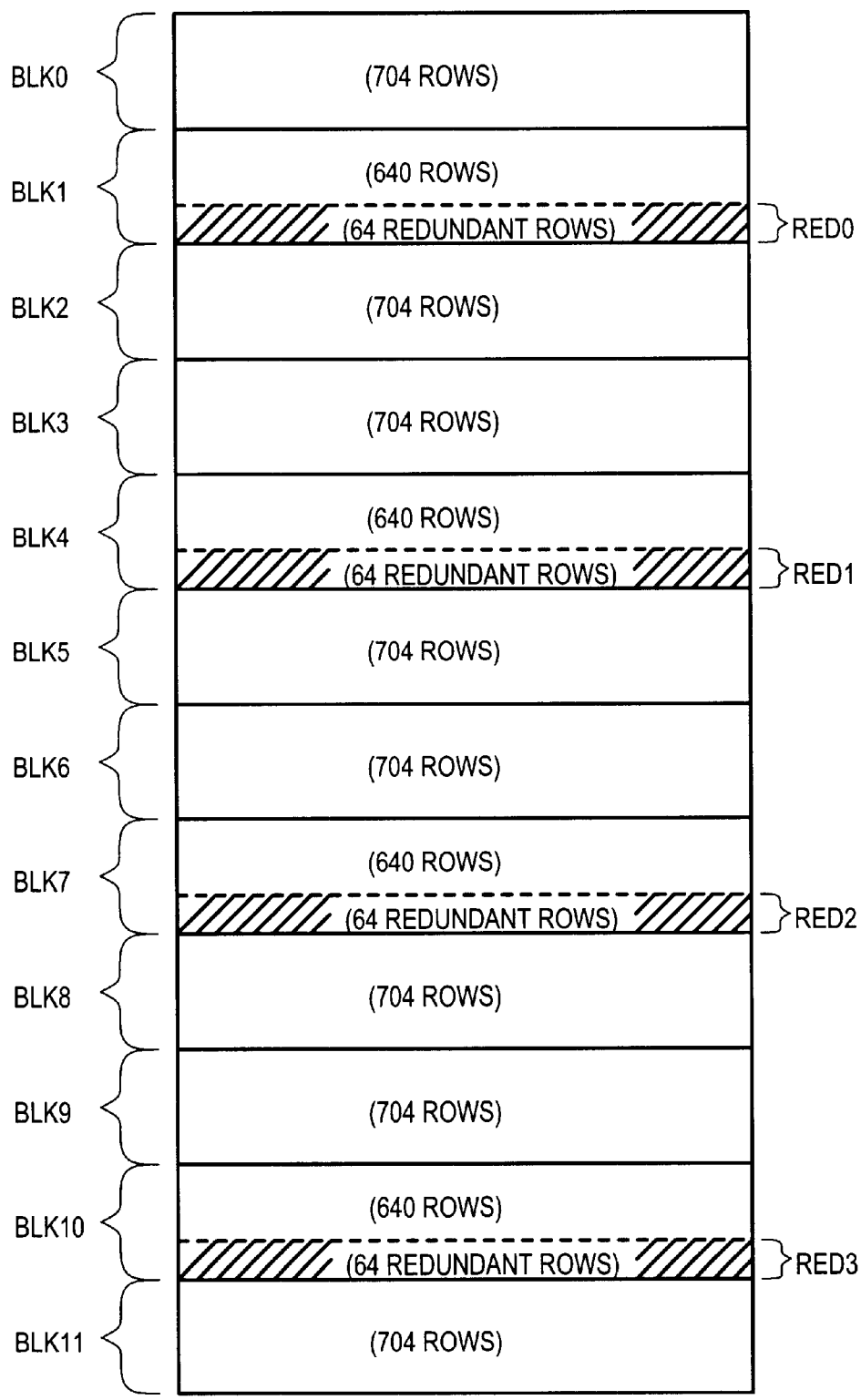
FIG. 11 is a block schematic diagram of a sub-array including redundant rows according to one embodiment.

Referring now to FIG. 11, a block schematic diagram of a sub-array including redundant rows according to one embodiment is set forth.

Sub-array SARY may include blocks (BLK0 to BLK11). As noted earlier, blocks (BLK1, BLK4, BLK7 and BLK10) may have 640 rows. However, blocks (BLK0, BLK2, BLK3, BLK5, BLK6, BLK8, BLK9, and BLK11) may have 704 rows. Redundant rows (filler rows) may be provided in the block, which have fewer rows. In this case, 64 redundant rows (RED0 to RED3) may be provided in blocks (BLK1, BLK4, BLK7 and BLK10), respectively.

Redundant rows (RED0 to RED3) may be programmed to replace defective rows. Redundant rows (RED0 to RED3) may not be limited to replacing defective rows within the block in which they are located. Redundant rows (RED0 to RED3) may be programmed to replace defective rows in any block (BLK0 to BLK11).

By providing redundant rows (RED0 to RED3) bit line imbalances among banks (BNK0 to BNK11) may be reduced.

In the embodiment illustrated in FIGS. 1 to 11, the number of blocks (BLK0 to BLK11) may be reduced based on a desired capacitance ratio (Cd/Cs) without regard to providing a number of blocks determined by a power of 2. In the example illustrated, the number of blocks may be reduced from sixteen to twelve. This may decrease the number of sense amplifier circuits, block selection circuits, and other block support circuits. The reduction of such support circuitry may be by a factor of 1.33, as just one example. This may decrease the chip size and may provide a more efficient bit/area in a semiconductor memory device.

A second embodiment will now be explained with reference to FIGS. 12 to 15.

Figures 12A, 12B:
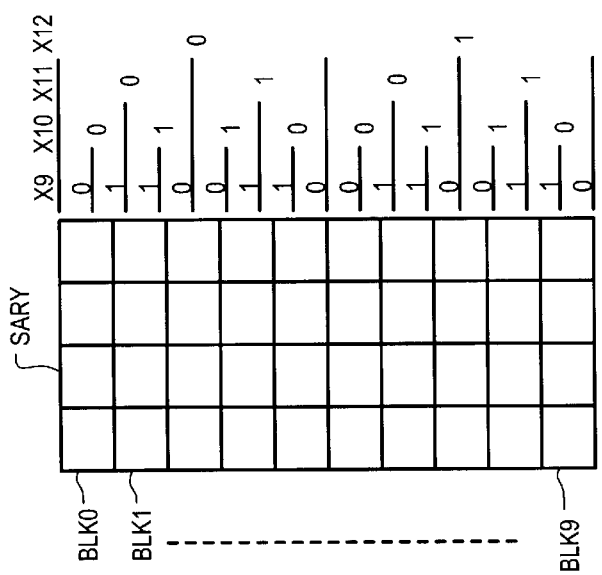
FIG. 12A is a bit map illustrating the sub-array configuration according to an embodiment.
FIG. 12B is a bit map illustrating the configuration of a group of blocks according to an embodiment.

Referring now to FIGS. 12A and 12B, the sub-array configuration and address bit map according to a second embodiment are illustrated.

The sub-array SARY of FIG. 12A may be divided into ten blocks (BLK0 to BLK9). Blocks (BLK0 to BLK9) may be divided into two groups (BLK0 to BLK4 and BLK5 to BLK9). Each may have similar bit maps with respect to row addresses (X6 to X11). Thus, a group may be repeated and have similar decoding.

FIG. 12B illustrates the bit map for a group of blocks (BLK0 to BLK4). The bit map may be symmetrical around the center of a center block BLK2.

Figure 13:
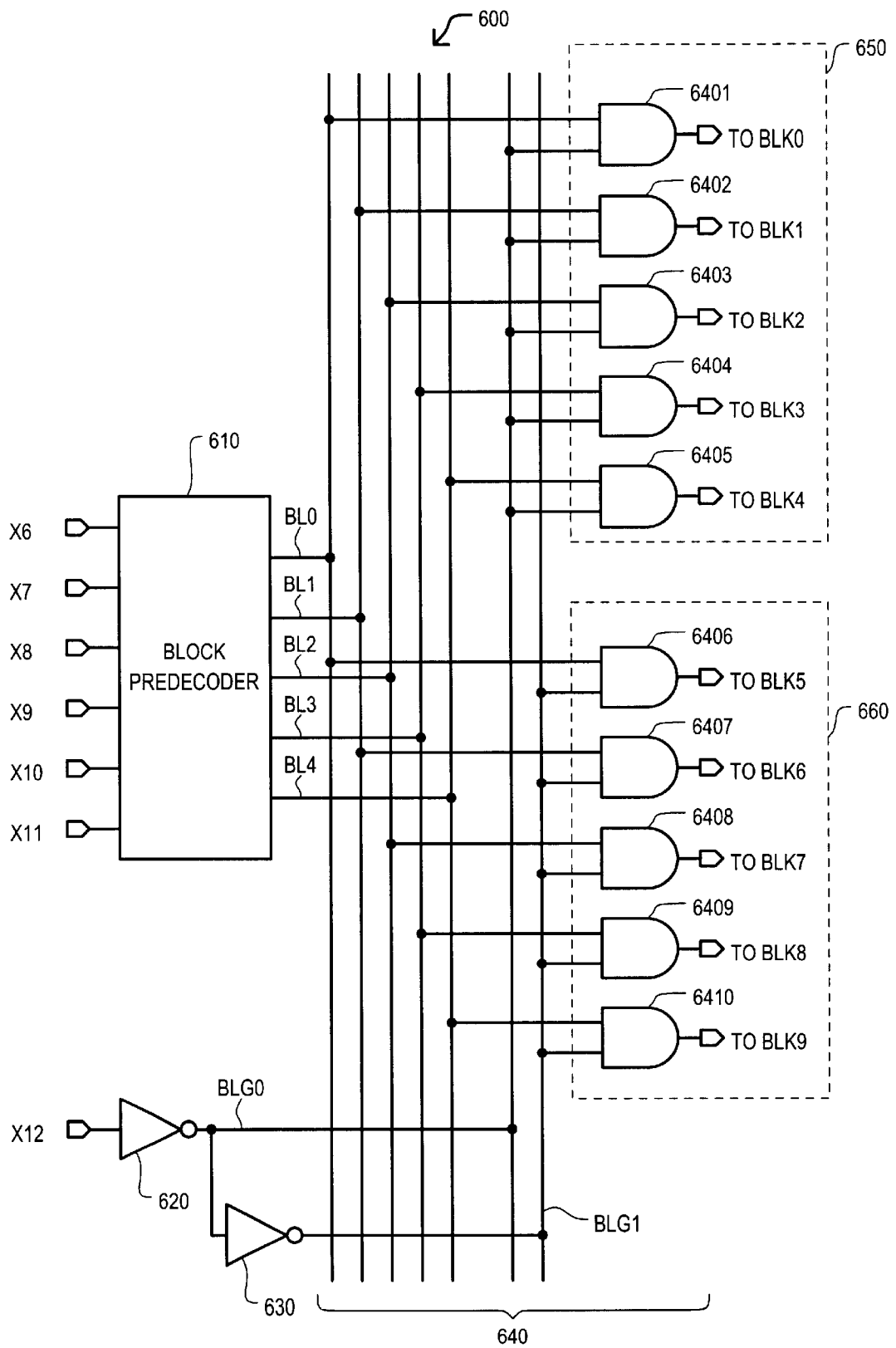
FIG. 13 is a block selector according to one embodiment.

Referring now to FIG. 13, a block schematic diagram of a block selector according to the second embodiment is set forth and given the general reference character 600.

Block selector 600 can include a block predecoder 610, inverters (620 and 630), and a block decoder 640.

Block predecoder 610 may receive row addresses (X6 to X11) and may provide predecode signals (BL0 to BL4) to block decoder 640. Predecode signals (BL0 to BL4) may select one of five blocks in a repeated group of blocks (BLK0 to BLK4 and BLK5 to BLK9).

Inverter 620 may receive row address X12 and may provide a block group select signal BLK0 as an output. Inverter 630 may receive block group select signal BLK0 and may provide a block group select signal BLG1 as an output.

Block decoder 640 may receive predecode signals (BL0 to BL4) and block group select signals (BLG0 and BLG1) and may provide a block select signal to each block (BLK0 to BLK9). Block decoder may include decode circuits (6401 to 6410). Decode circuits (6401 to 6410) may be AND gates. Decode circuits may be arranged into groups of decode circuits (650 and 660). Block group select signals (BLG0 and BLG1) may enable a group of decode circuits (650 or 660). Predecode signals (BL0 to BL4) may select one of five decode circuits (6401 to 6405 and 6406 to 6410) in a group of decode circuits (650 and 660). In this way, one block (BLK0 to BLK9) may be selected.

Figure 14:
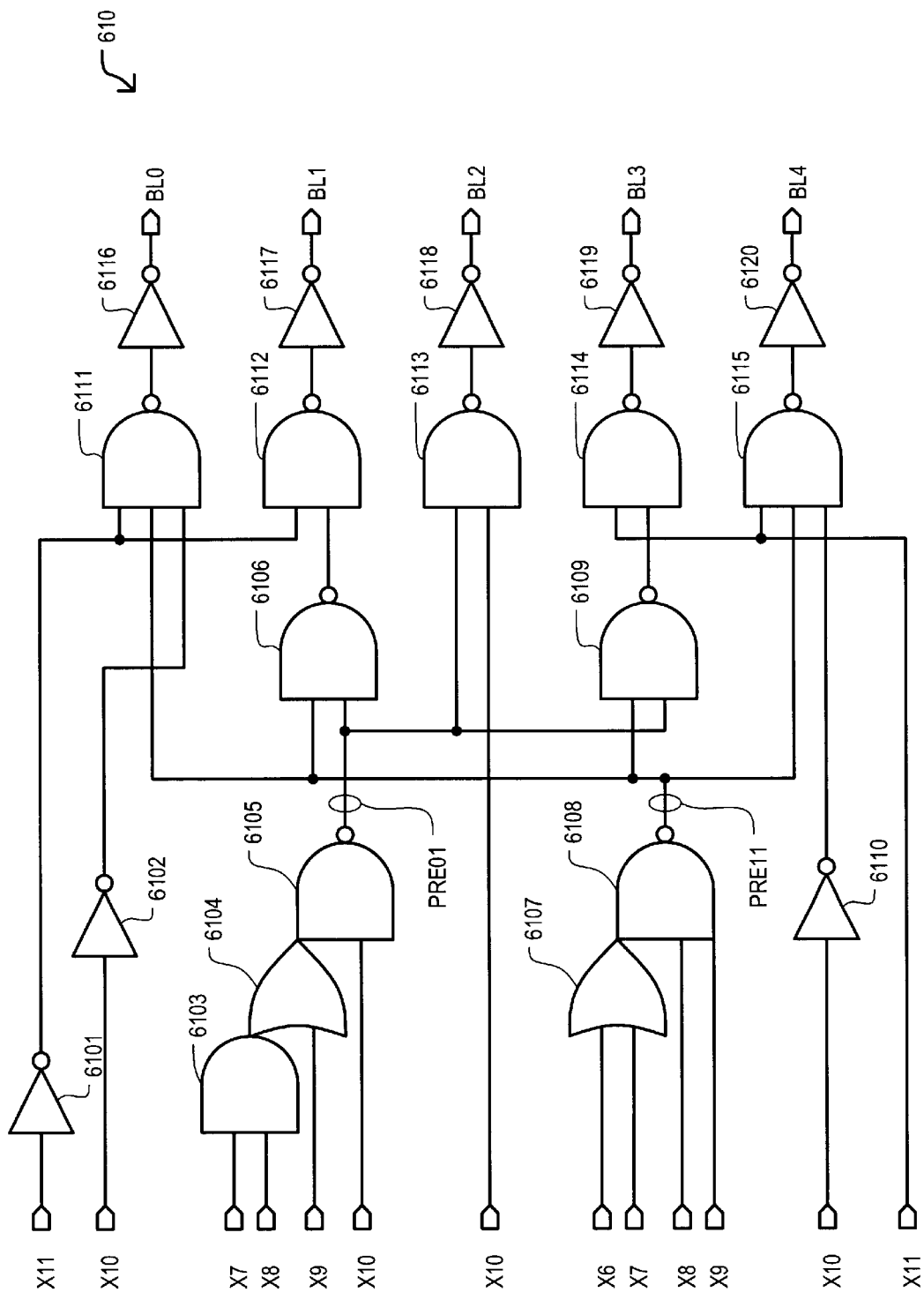
FIG. 14 is a logic schematic diagram of block predecoder according to one embodiment.

Referring now to FIG. 14, a logic schematic diagram of block predecoder 610 according to one embodiment is set forth. Block predecoder 610 of FIG. 14 may be used as block predecoder 610 of FIG. 13.

Block predecoder 610 may include inverters (6101, 6102, 6110, and 6116 to 6120), an AND gate 6103, OR gates (6104 and 6107), and NAND gates (6105, 6106, 6108, 6109, and 6111 to 6115).

Row address X11 may be input to inverter 6101. Row address X10 may be input to inverter 6102. Row addresses (X7 and X8) may be input to AND gate 6103. The output of AND gate 6103 and row address X9 may be input to OR gate 6104. The output of OR gate 6104 and row address X10 may be input to NAND gate 6105. NAND gate 6105 may generate signal PRE01.

Row addresses (X6 and X7) may be input to OR gate 6107. The output of OR gate 6107 and row addresses (X8 and X9) may be input to NAND gate 6108. NAND gate 6108 may generate signal PRE11.

The output of inverters (6101 and 6102) and the signal PRE11 may be applied to NAND gate 6111. The output of NAND gate 6111 may be applied to inverter 6116. Inverter 6116 may generate predecode signal BL0.

Signals (PRE01 and PRE11) may be applied to inputs of NAND gate 6106. The output of inverter 6101 and NAND gate 6106 may be applied to NAND gate 6112. The output of NAND gate 6112 may be applied to inverter 6117. Inverter 6117 may generate predecode signal BL1.

Row address X10 and signal PRE01 may be applied to inputs of NAND gate 6113. The output of NAND gate 6113 may be applied to inverter 6118. Inverter 6118 may generate predecode signal BL2.

Signals (PRE01 and PRE11) may be applied to inputs of NAND gate 6109. Row address X11 and the output of NAND gate 6109 may be applied to inputs of NAND gate 6114. The output of NAND gate 6114 may be applied to inverter 6119. Inverter 6119 may generate predecode signal BL3.

Row address X11, the output of inverter 6110, and the signal PRE11 may be applied to NAND gate 6115. The output of NAND gate 6115 may be applied to the input of inverter 6120. Inverter 6120 may generate predecode signal BL4.

Figure 15:
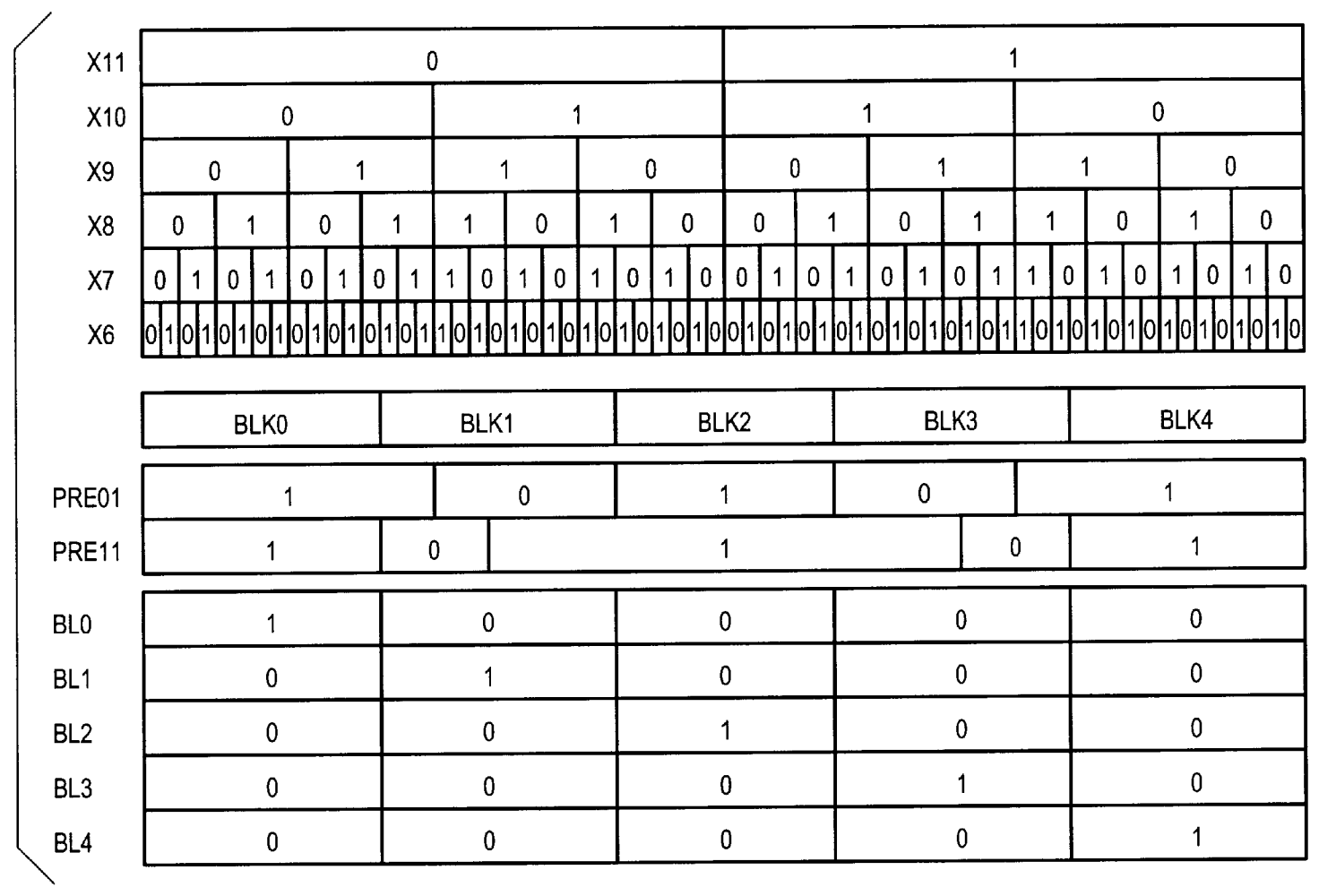

Referring now to FIG. 15, a bit map of row addresses (X6 to X11) for generating predecode signals (BL0 to BL4) is set forth. The bit map of FIG. 15 also illustrates the generation of signals (PRE01 and PRE11).

Block predecoder 610 illustrated in FIG. 14 may generate predecode signals (BL0 to BL4) according to the bit map illustrated in FIG. 15.

As noted earlier blocks (BLK0 to BLK4) may form a group of blocks that are repeated as far as the bit mapping of row addresses (X6 to X11) are concerned. Block BLK2 may form a center block, which may have a center in which the bit map may form a mirror image with respect to row addresses (X6 to X10). Thus, end blocks (BLK0 and BLK4) may have identically mirrored bit maps with respect to row addresses (X6 to X10). The end blocks may be distinguished by row address X11. Likewise, blocks (BLK1 and BLK3) may have identically mirrored bit maps with respect to row addresses (X6 to X10). In this way, a block (BLK0 to BLK4) from a group of blocks may be selected by row addresses (X6 to X11).

Also, the bit map with respect to row addresses (X6 to X9) may form a mirror image within block BLK1. In this way, the bit map may have multiple mirror image folds and may have multiple symmetrical regions within a group of blocks.

Referring back to FIG. 13, block selector 600 may then select a group of blocks (BLK0 to BLK4 and BLK5 to BLK9) based on the value of row address X12.

In the second embodiment illustrated in FIGS. 12 to 15, the number of blocks (BLK0 to BLK9) may be reduced based on a desired capacitance ratio (Cd/Cs) without regard to providing a number of blocks determined by a power of 2. In the example illustrated, the number of blocks may be reduced from sixteen to ten. This may decrease the number of sense amplifier circuits, block selection circuits, and other block support circuits. The reduction of such support circuitry may be by a factor of 1.6, as just one example. This may decrease the chip size and may provide a more efficient bit/area in a semiconductor memory device.

A third embodiment will now be explained with reference to FIGS. 16 to 18.

In previously discussed embodiments, the bit map of addresses for selecting blocks may have included addresses that may be used for selecting rows (word lines). The bit map may be symmetrical for both the block selection and the row selection. In the third embodiment, only the bit map of addresses used for selecting blocks may be symmetrical.

Figure 16:
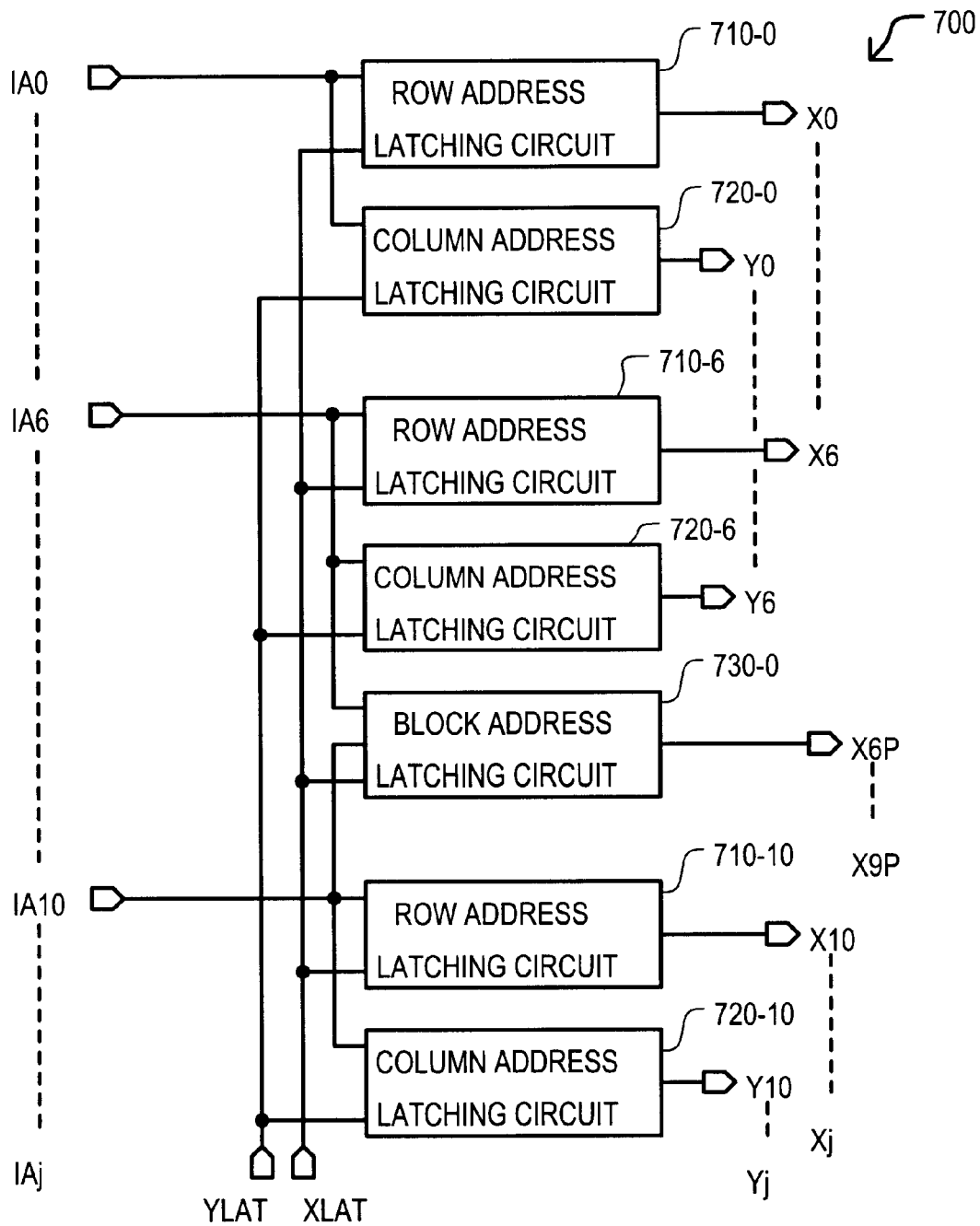
FIG. 16 is a block schematic diagram of an address generator according to an embodiment.

Referring now to FIG. 16, a block schematic diagram of an address generator is set forth according to a third embodiment and given the general reference character 700.

Address generator 700 can receive internal addresses (IA0 to IAj), row address latch signal XLAT, and column address latch signal YLAT. Address generator 700 may provide latched row addresses (X0 to Xj), latched column addresses (Y0 to Yj), and predecoded block addresses (X6P to X9P) as outputs.

Address generator 700 may include row address latching circuits (710-0 to 710-j), column address latching circuits (720-0 to 720-j), and block address latching circuits (730-0 to 730-3). Row address latching circuits (710-0 to 710-j) may receive internal addresses (IA0 to IAj), respectively and row address latch signal XLAT and may generate latched row addresses (X0 to Xj). Column address latching circuits (720-0 to 720-j) may receive internal addresses (IA0 to IAj), respectively and column address latch signal YLAT and may generate latched column addresses (Y0 to Yj). Block address latching circuits (730-0 to 730-3) may receive internal addresses (IA6 to IA9), respectively, internal address IA10, and row address latch signal XLAT and may generate predecoded block addresses (X6P to X9P).

Internal addresses (IA0 to IAj), row address latch signal XLAT, and column address latch signal YLAT may be generated in generally the same manner as discussed with reference to the address generator 500 in FIG. 10. Also, row address latching circuits (710-0 to 710-j) and column address latching circuits (720-0 to 720-j) may operate in generally the same manner as discussed with reference to the address generator 500 in FIG. 10.

Figure 17A:
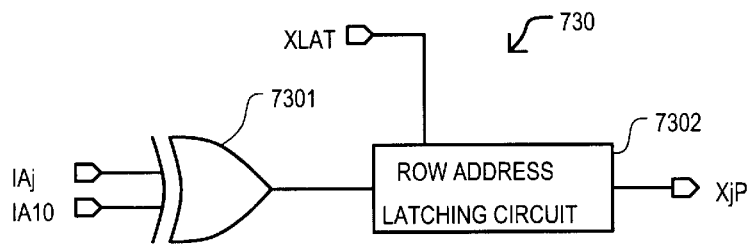
FIG. 17A is a logic schematic diagram of block address latching circuit according to one embodiment.

Referring now to FIG. 17A, a logic schematic diagram of block address latching circuit 730 according to one embodiment is set forth. Block address latching circuit 730 may be used as block address latching circuits (730-0 to 730-3) in the address generator 700 of FIG. 16.

Block address latching circuit 730 may receive internal addresses (IAj and IA10) and row address latch signal XLAT and may generate a predecoded block address XjP. Block address latching circuit 730 may include an exclusive OR (XOR) logic gate 7301 and a row address latching circuit 7302.

XOR logic gate 7301 may receive internal addresses (IAj and IA10). The output of XOR logic gate 7301 and row address latch signal XLAT may be input to row address latching circuit 7302. Row address latching circuit 7302 may generate the predecoded block address XjP. Row address latching circuit 7302 may be a flip-flop type circuit.

Figure 17B:
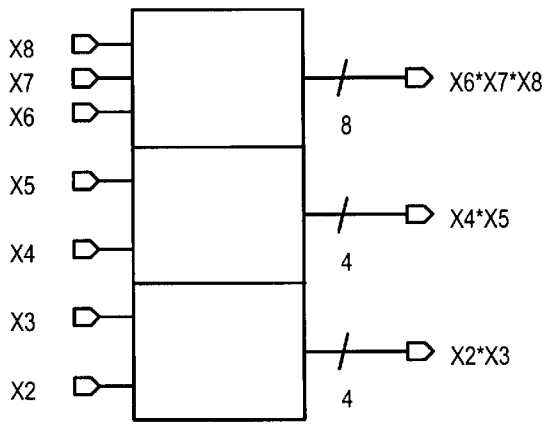
FIG. 17B is a block schematic diagram illustrating the predecoding of row addresses according to an embodiment.

Referring now to FIG. 17B, a block schematic diagram illustrating the predecoding of row addresses (X2 to X8) according to an embodiment is set forth.

Row addresses (X6 to X8) may be predecoded into a one-of-eight selection (X6*X7*X8). Row addresses (X4 and X5) may be predecoded into a one-of-four selection (X4*X5). Row addresses (X2 and X3) may be predecoded into a one-of-four selection (X2*X3). The predecoded signals (X6*X7*X8, X4*X5, X2*X3) may be applied to a row decoder (not shown) for selecting a word line in the third embodiment.

Figure 17C:
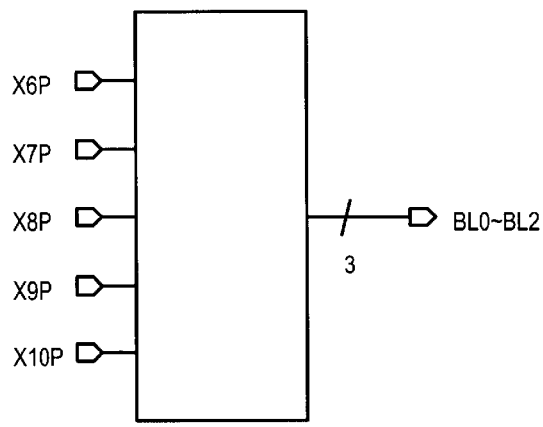
FIG. 17C is a block schematic diagram illustrating the decoding of predecoded block select signals according to an embodiment.

Referring now to FIG. 17C, a block schematic diagram illustrating the decoding of predecoded block select signals (X6P to X9P) according to one embodiment is set forth.

Predecoded block select signals (X6P to X9P) may be applied to a block decoder, such as block predecoder 410 illustrated in FIG. 7. In this way, predecode signals (BL0 to BL2) may be generated.

Figures 18A, 18B:
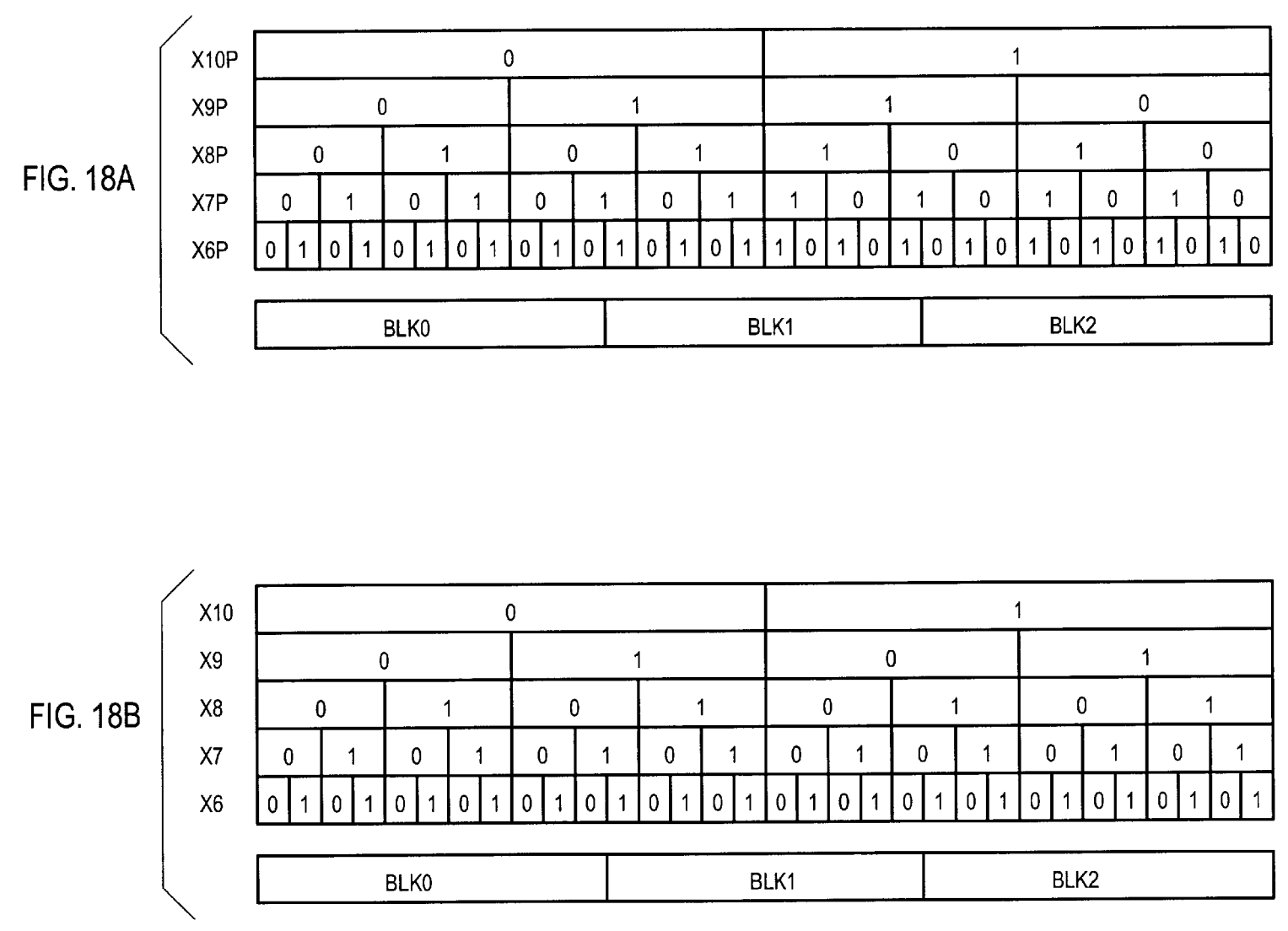

Referring now to FIG. 18A, a bit map of block addressing according to the third embodiment is set forth.

It is noted that the bit map illustrated in FIG. 18A, is similar to the bit map illustrated in FIG. 8B, except predecoded block addresses (X6P to X9P) may be used instead of row addresses (X6 to X9). The bit map may be symmetrical around a center of a center block BLK1 in a group of blocks as in other embodiments.

Referring now to FIG. 18B, a bit map of selected addresses for word line addressing according to the third embodiment is set forth. FIG. 18B, illustrates the bit map for row addresses (X6 to X10). The bit map illustrated in FIG. 18B is a conventional bit map. It may be seen that the word lines may be selected according to a conventional bit map in the third embodiment.

Referring once again to FIG. 17A, block address latching circuit 730 may operate to latch internal address IAj without any logic change when row address X10 is a logic zero. However, block address latching circuit 730 may operate to latch logically inverted internal address IAj when row address X10 is a logic one. This may serve to provide a symmetrical bit map as illustrated in FIG. 18A. Then, when the bit map as illustrated in FIG. 18A may be applied to a block predecoder, such as block predecoder 410 as illustrated in FIG. 8A, the block selection may correspond with the conventional row selection in the bit map as illustrated in FIG. 18B. In this way, row decoders may be conventionally programmed and the logic for a symmetrically selected block may be used without complicating logic.

According to the third embodiment, the circuit system for selecting word lines and the circuit system for selecting blocks may be provided separately. Thus, the memory cell array may be divided into a number of block other than a multiple of two without altering the bit map of the row addresses for selecting the rows. This may simplify circuit alterations and the division of the blocks into a number other than a factor of two may be simplified.

It is understood that the embodiments described above are exemplary and the present invention should not be limited to those embodiments.

For example, in the embodiments, blocks (BLK0 to BLK11) may be divided into four block sections by column address signals (Y7 and Y8). However, blocks may not need to be divided into block sections or may be divided into any arbitrary number of block sections.

Also, although the embodiments described above use three or five blocks as a repeated unit of blocks, this should not be construed as a limitation. The blocks may be divided into any uneven number as necessary. The bit map may have multiple folds.

When the number of divisions is a prime number such as eleven or thirteen, the bit map may have a fold at the center of a center block and no repetition, as just one example.

Although an embodiment illustrated used redundant rows in blocks that may have had fewer rows than other blocks, redundant rows may not be necessary. A block may have a different number of rows than another block.

The above embodiments are illustrated with an SDRAM by way of example, but this should not be construed as a limitation. The invention may be applied to other types of semiconductor memories.

The above embodiments illustrate how a memory cell array may be divided into a number of blocks that is not a factor of two without complicating circuitry. In this way, design freedom may be increased and may enable a memory to accommodate increased bit capacity.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   a memory cell array divided into a plurality of blocks which are addressable by a plurality of addresses, the plurality of blocks being divided into a plurality of block groups each having an uneven number of blocks; and the plurality of blocks is a number of blocks other than 2 to the $N^{th}$ power where N is a natural number.

2. The semiconductor memory device according to claim 1, wherein:

the plurality of addresses includes at least one higher order address for selecting one of the plurality of block groups.

3. The semiconductor memory device according to claim 1, wherein:

each block group includes a center block; and a portion of a bit map of the plurality of addresses is symmetrical around the center of the center block.

4. The semiconductor memory device according to claim 1, wherein:

a first block from the plurality of blocks has fewer rows than a second block from the plurality of blocks.

5. The semiconductor memory device according to claim 1, wherein:

a first block from the plurality of blocks includes normal rows and filler rows; and a second block from the plurality of blocks includes normal rows and the number of normal rows in the second block equals the number of normal rows plus filler rows in the first block.

6. A semiconductor memory device according to claim 5, wherein the filler rows are redundant rows that can be used to replace a normal row.

7. A semiconductor memory device, comprising:

a plurality of address signals;

a memory cell array divided into a plurality of blocks where the plurality of blocks is a number of blocks other than 2 to the $N^{th}$ power where N is a natural number, the plurality of blocks being divided into a plurality of block groups that each include an uneven number of blocks; and a block selector coupled to receive the plurality of address signals and select one of the plurality of blocks.

8. The semiconductor memory device according to claim 7, wherein:

the block selector includes a first predecoder coupled to receive at least a first one of the plurality of address signals and provide a plurality of first select signals coupled to select a block group.

9. The semiconductor memory device according to claim 8, wherein:

the block selector further includes a second predecoder coupled to receive at least a second one of the plurality of address signals and provide a plurality of second select signals coupled to select at least one block from a block group.

10. The semiconductor memory device according to claim 9, wherein:

the block selector further includes a plurality of block decoders, each block decoder coupled to receive at least one first select signal and at least one second select signal and provides a block select signal coupled to select a block.

11. The semiconductor memory device according to claim 10, wherein:

the plurality of block decoders are divided into a plurality of block decoder groups and the first predecoder selects a block decoder group and the second predecoder selects one block decoder from a block decoder group.

12. The semiconductor memory device according to claim 8, wherein:

each block group has the same bit map with respect to a lower order set of the plurality of addresses.

13. The semiconductor memory device according to claim 12, wherein:

the bit map of the lower order set of the plurality of addresses is symmetrical around the center of a center block in each block group.

14. A semiconductor memory device, comprising:

a plurality of first address latches coupled to receive first externally applied address signals and provide first address signals;

a memory cell array divided into a plurality &f blocks where the plurality of blocks is a number of blocks other than 2 to the $N^{th}$ power where N is a natural number, the plurality of blocks being divided into a plurality of block groups that each include an uneven number of blocks; and a block selector coupled to receive the first address signals and select one of the plurality of blocks.

15. The semiconductor memory device according to claim 14, wherein:

each of the first address latches include an exclusive OR logic combination of one of the first external address signals and a second externally applied address signal.

16. The semiconductor memory device according to claim 15, further including:

a plurality of second address latches coupled to receive the first externally applied address signals and provide row address signals; and a row decoder coupled to receive the row address signals and select a row of memory cells.

17. The semiconductor memory device according to claim 16, wherein:

the plurality of blocks are divided into a plurality of block groups, each block group having an uneven number of blocks including a center block;

the bit map of at least a portion of the first address signals is symmetrical around the center of the center block of a block group; and the bit map of row address signals is not symmetrical around the center of the center block of a block group.

18. The semiconductor memory device according to claim 14 is a dynamic random access memory.

* * * * *